(12) United States Patent
Chiba et al.

(10) Patent No.: US 6,380,918 B1
(45) Date of Patent: Apr. 30, 2002

(54) LIQUID CRYSTAL DISPLAY DEVICE

(75) Inventors: Shinsaku Chiba; Tohko Anabuki, both of Mobara; Hiroyuki Takahashi, Tokyo, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/253,135

(22) Filed: Feb. 19, 1999

(30) Foreign Application Priority Data

Feb. 19, 1998 (JP) .......................................... 10-037380

(51) Int. Cl.⁷ ................................................. H05K 1/00
(52) U.S. Cl. ....................................................... 345/90
(58) Field of Search ............................. 345/90, 92, 80, 345/55, 58, 99; 174/261, 264–266

(56) References Cited

U.S. PATENT DOCUMENTS

| | | | | |
|---|---|---|---|---|
| 5,278,524 A | * | 1/1994 | Mullen ........................... | 333/1 |
| 5,297,107 A | * | 3/1994 | Mezger et al. ............... | 361/778 |
| 5,451,721 A | * | 9/1995 | Tsukada et al. .............. | 174/261 |
| 5,618,185 A | * | 4/1997 | Aekins .......................... | 331/1 |
| 5,691,662 A | * | 11/1997 | Soboleski et al. ........... | 327/292 |

* cited by examiner

*Primary Examiner*—Almis R. Jankus
(74) *Attorney, Agent, or Firm*—Antonelli, Terry, Stout & Kraus, LLP

(57) ABSTRACT

In a liquid crystal display device comprising, first and second substrates and a liquid crystal layer sealed therebetween constituting a panel, a first plurality of electrodes extending in a first direction in the panel, a second plurality of electrodes being extending in the second direction transverse to the first direction in the panel, a first printed circuit board having a laminated structure of a plurality of printed circuit layers and disposed at a periphery of the panel extending along the second direction, and a plurality of first driver circuits juxtaposed between the first printed circuit board and the panel in the second direction and having a plurality of electrical contacts with the first printed circuit board on its first printed circuit layer from its upper surface so as to supply the at least one clock signal in parallel to the respective first driver circuits, the present invention disposes a transmitting line for the at least one clock signal on one of the printed circuit layers of the a first printed circuit board closer to its upper surface than a center of its laminated thickness. By this configuration, the present invention reduce parasitic capacitance occurring along a signal path of the at least one clock signal sufficiently so as to obtain a high-quality liquid crystal display without flicker caused by miscounting of pixel clock signals or like.

25 Claims, 18 Drawing Sheets

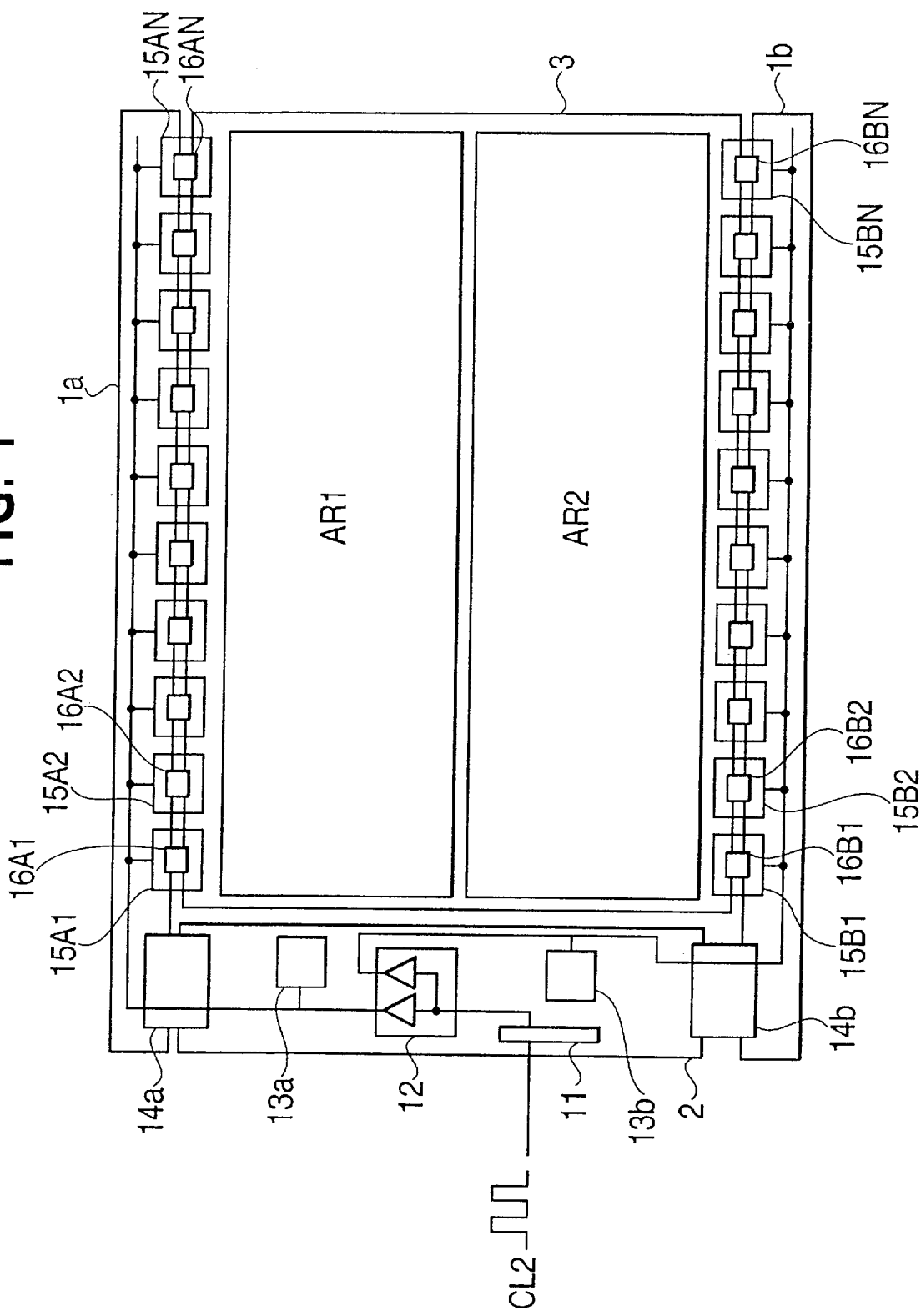

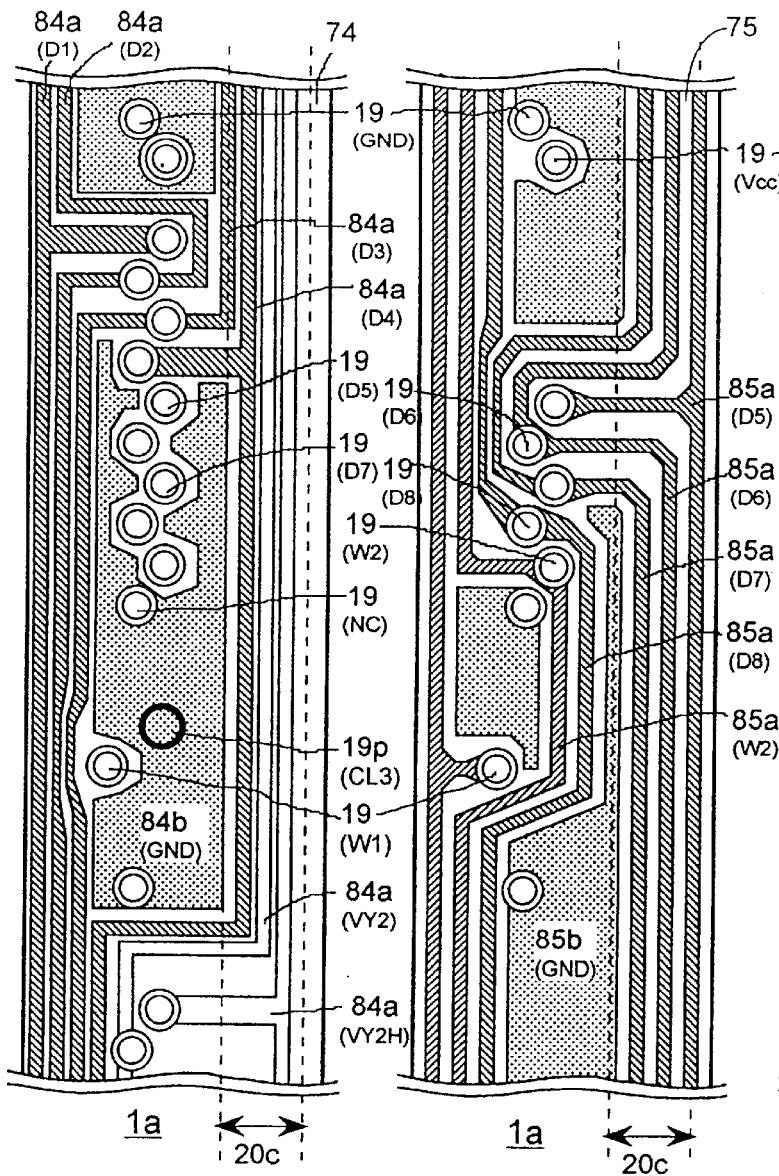

LIQUID CRYSTAL DISPLAY DEVICE

BACKGROUND OF THE INVENTION

1. Field of the Invention

The present invention relates to a liquid crystal display and more particularly to a liquid crystal display which prevents miscounting of clock signals entered into a driver circuit such as a segment drive circuit that supplies an image drive voltage to each pixel, thereby eliminating flicker on the screen.

2. Description of the Related Art

A liquid crystal display has a liquid crystal panel which comprises a pair of substrates (liquid crystal substrates), at least one of which is transparent, whose display surface is constructed of an array of fine patterns constituting respective pixels. According to the liquid crystal drive control method, there are two types of liquid crystal displays. One is a passive matrix display using a so-called STN liquid crystal material in which pixels are formed at intersections of a pair of upper and lower stripes of electrodes, and another is an active matrix display in which switching devices such as thin-film transistors are provided for individual pixels.

In the passive matrix type, the liquid crystal panel holds a liquid crystal layer of liquid crystal material between a first substrate having a first electrode group (hereinafter referred to as a segment electrode group) formed in a direction bridging one pair of parallel sides of the substrate forming a rectangular screen, and a second substrate having a second electrode group (hereinafter referred to as a common electrode group) formed in a direction crossing the segment electrode group. The liquid crystal panel also has a first multilayer printed circuit board and a second multilayer printed circuit board. The first multilayer printed circuit board is connected to and applies a pixel drive voltage to the segment electrode group through a plurality of segment drive circuits (or segment drivers), each of which is mounted on a tape carrier pad (or TCP) for every two or more segment electrodes. The second multilayer printed circuit board is connected to and applies a common voltage to the common electrode group through a plurality of common drive circuits (or common drivers), each of which is mounted on the TCP for every two or more common electrodes.

On the second multilayer printed circuit board, drive circuits are mounted thereon. The drive circuit applies an image data voltage to the segment electrodes in response to a line clock signal (line pulse, generally denoted CL1), a pixel clock signal (pixel pulse, generally denoted CL2), and a frame clock signal (frame pulse, generally denoted CL3), all supplied from a host computer side.

The pixel clock signal CL2 is received in from a controller on the host computer side and then supplied at a predetermined level through a buffer circuit to a clock line. The clock line is wired both on the second multilayer printed circuit board and on the first multilayer printed circuit board. The clock line on the first multilayer printed circuit board is connected in parallel to a plurality of segment drivers parallelly. Each of the segment drivers counts the clock signal and applies the image data voltage to predetermined pixels, when a predetermined count value is reached.

FIG. 1 is a schematic diagram showing a conventional liquid crystal display having a liquid crystal panel and multilayer printed circuit boards arranged in this liquid crystal panel. In this liquid crystal display, the screen area of a liquid crystal panel 3 is divided into an upper half and a lower half, which are scanned in parallel. An upper screen area AR1 is driven by a plurality of segment drivers 16A1 to 16AN mounted on TCPs 15A1 to 15AN connecting the liquid crystal panel 3 to a segment substrate 1a. The segment substrate 1a is the first multilayer printed circuit board arranged on the upper side of the panel. A lower screen area AR2 is driven by a plurality of segment drivers 16B1 to 16BN mounted on TCPs 15B1 to 15BN connecting the liquid crystal panel 3 to a segment substrate 1b. The segment substrate 1b is the first multilayer printed circuit board arranged on the lower side of the panel.

On a common substrate 2 as the second multilayer printed circuit board, a connector 11, a buffer circuit 12 and logic control circuits 13a, 13b are mounted. The buffer circuit 12 divides the pixel clock signal CL2, receiving from the controller of the host computer to the connector 11, into two systems of clock line. As described above, the upper screen area AR1 is driven by a plurality of segment drivers 16A1 to 16AN arranged on the upper side of the liquid crystal panel and the lower screen area AR2 is driven by a plurality of segment drivers 16B1, to 16BN arranged on the lower side. The frame clock signal CL3 is a signal to determine the start timing of the screen (vertical synchronization signal) and the line clock signal CL1 is a signal to define the start timing of one horizontal scan (horizontal synchronization signal). Explanations of the operation of these two signals are omitted. Signal lines for the clock signal CL1, the pixel clock signal CL2, and the frame signal clock CL3 are generally disposed on both the first multilayer printed circuit board and the second multilayer printed circuit board, and are connected by joiners 14a, 14b between these printed circuit boards.

FIGS. 2(a) and 2(b) are schematic diagrams showing the configuration of a conventional multilayer printed circuit board on the segment side, with FIG. 2(a) representing a perspective view of an essential portion and FIG. 2(b) representing a cross section of FIG. 2(a) taken along the line 2B—2B.

A segment substrate 1a, which is the first multilayer printed circuit board, is arranged on the upper side of the liquid crystal panel 3 as shown in (a) and connected to the panel through the TCP 15A1, 15A2, . . . 15AN mounting the segment drivers 16A1, 16A2, . . . 16AN.

The liquid crystal display of the aforementioned type is described in, for example, Japanese Patent Laid-Open No. 70601/1985 and Japanese Patent Publication No. 13666/1976.

As shown in FIG. 2(b), the multilayer printed circuit board 1a has six to ten layers of laminated wire 17 and the clock signal wire 18 is generally arranged on a layer a large distance away from the TCP (generally the lower layer of the multilayer printed circuit board 1a). A solder connecting portion 20 of the TCP (TCP 15A1 in the figure) is connected to the pixel clock wire 18 through a through-hole 19. The wire 18 for the pixel clock signal CL2 serves as a high-speed clock signal on the lower layer, and the inventors have discovered that a capacitive component (parasitic capacitance) is formed in the through-hole 19 region, causing reflection.

FIG. 3 shows an equivalent circuit of the clock wire and FIG. 4 shows a waveform of the pixel clock signal CL2. $C_{TCP}$ in FIG. 3 represents an input capacitance of TCP 15A1, . . . 15AN, and $C_T$ represents a parasitic capacitance of the clock wire. The clock signal CL2 from the buffer circuit 12 is supplied through the clock wire, and counted by the segment driver 16A1, . . . 6AN, of each TCP. When the count reaches its predetermined value, each of the segment drivers receives data and applies the pixel voltage to the segment wire.

The aforementioned parasitic capacitance $C_T$ in the clock wire makes the reflected component (−) so large so that a waveform of the clock signal CL2 is distorted as shown at R in FIG. 4. When the counting by the segment driver 16A1, . . . 16AN is performed at the high-to-low transition of the clock signal waveform, a miscounting is caused by a waveform deformation as shown at R in FIG. 4 which occurs near a threshold $V_{TH}$ Of the high level H and the low level L, resulting in a problem of degraded display quality such as occurrence of flicker on the screen.

SUMMARY OF THE INVENTION

An object of the present invention is to overcome the above-described problems experienced with prior art and to provide a high-quality liquid crystal display without occurrence of flicker on the screen.

To achieve the above objective, the present invention arranges a clock signal wire supplying a high-speed clock signal to the liquid crystal drive circuit on a layer close to the surface connected with the TCP in the multilayer printed circuit board. Thereby, the through-hole for connecting the clock signal wire and the TCP can be of a short length which is sufficient to reduce the parasitic capacitance.

In accordance with the present invention, a liquid crystal display device includes a liquid crystal panel having a liquid crystal layer held between a first substrate and a second substrate, the first substrate having a first electrode group extending in a first direction, and the second substrate having a second electrode group extending in a second direction transverse to the first direction, a first multilayer printed circuit board being connected to the first electrode group through a tape carrier pad carrying a plurality of segment drive circuits to apply a pixel drive voltage to the first electrode group, the tape carrier pad being connected with an uppermost wiring layer of the first multilayer printed circuit board, and a second multilayer printed circuit board being connected to the second electrode group through a tape carrier pad carrying a plurality of common drive circuits to apply a common voltage to the second electrode group, the second multilayer printed circuit board having a drive circuit to supply an externally applied pixel clock signal to the segment drive circuits, wherein a high-speed clock signal wire is disposed on one layer of the first multilayer printed circuit board which is located close to an upper surface of the first multilayer printed circuit board so as to reduce parasitic capacitance therealong.

According to a feature of the present invention, a pixel clock signal wire is disposed as the high-speed clock signal wire.

In accordance with the present invention, the through-hole for connecting the clock signal wire and the TCP is shortened and the parasitic capacitance and the reflection noise according thereto are reduced, whereby a liquid crystal display can be obtained without flicker of the displayed images.

In addition to the pixel clock signal wire, this invention can also be applied similarly to other wires such as line clock signal (line pulse CL1) and frame clock signal (frame pulse CL3).

A liquid crystal display device in accordance with the present invention may also include the following features:
(A) first and second substrates having main surfaces thereof opposed to one another so as to constitute a panel;
(B) a liquid crystal layer sealed between the first and second substrates;
(C) a first plurality of electrodes being arranged with respect to the main surface of at least one of the first and second substrates and extending in a first direction;
(D) a second plurality of electrodes being arranged with respect to the main surface of at least one of the first and second substrates and extending in the second direction transverse to the first direction;
(E) a first printed circuit board disposed at a periphery of the panel extending along the second direction, and having a laminated structure of a plurality of printed circuit layers, and having a laminated thickness according to the plurality of printed circuits layers; and
(F) a plurality of first driver circuits juxtaposed between the first printed circuit board and the panel in the second direction, each of the first driver circuits having a voltage supply unit for applying voltages to at least one electrode of the first electrodes corresponding thereto, and at least one control unit for controlling the voltage supply in accordance with at least one clock signal transmitted by the first printed circuit board.

The present invention disposes "a transmitting line for the at least one clock signal" on "one of the printed circuit layers closer to an upper surface of the first printed circuit board the electrical contacts than a center of the laminated thickness of the first printed circuit board", when the first printed circuit board has a plurality of electrical contacts with the first driver circuits on a first printed circuit layer from an upper surface of the first printed circuit board so as to supply the at least one clock signal in parallel to the respective first driver circuits.

When the liquid crystal display device is of the passive matrix type, the first plurality of electrodes is generally arranged with respect to the main surface of the first substrate, and the second plurality of electrodes is generally arranged with respect to the main surface of the second substrate.

When the liquid crystal display device is of the active matrix type, both the first and second plurality of electrodes are generally arranged with respect to the main surface of only one of the first and second substrates.

According to the liquid crystal display structure, the transmitting line for the at least one clock signal may be disposed in the uppermost printed circuit layer of the first printed circuit board.

On the other hand, the transmitting line for the at least one clock signal may be disposed on one of the printed circuit layers other than the uppermost printed circuit layer (the above-identified first printed circuit layer), also. Defining the laminated thickness by the number N of the printed circuit layers except for the uppermost printed circuit layer, the one of the printed circuit layers should be within a number smaller than N/2 from the uppermost printed circuit layer. For example, when the first printed circuit board has at least six printed circuit layers, the transmitting line for the clock signal should be disposed in one of the second and third printed circuit layers from the upper surface of the first printed circuit board. The laminated thickness may be defined by the distance from an upper surface of the first printed circuit layer to a bottom surface of the last printed circuit layer of the laminated first printed circuit board, also.

The present invention has an advantage that when each control unit of the first driver circuits has a sequential logic circuit therein control signals are outputted for controlling voltage applications to the respective electrodes corresponding to the first driver circuit in accordance with the at least one clock signal.

The first printed circuit board may supply a signal other than the at least one clock signal (e.g., the second clock signal having a different frequency from that of the at least one clock signal) supplied in parallel to the respective first circuits by a second transmitting line formed therein. When the second transmitting line disposed on one of the printed circuit layers, on which the transmitting line for the at least one clock signal is disposed, the second transmitting line should be spaced from the transmitting line for the at least one clock signal. Regardless with the positions of these transmitting lines, the transmitting line for the at least one the clock signal should be spaced from the second transmitting line by at least one conductive material electrically connected with neither of these transmitting lines.

If the first printed circuit board has a second transmitting line for a second clock signal having a higher frequency than that of the at least one clock signal, the second clock signal should be disposed on one of the printed circuit layers further from the upper surface of the first printed circuit board than the printed circuit layer on which the transmitting line for the at least one clock signal is disposed. Disposing the second transmitting line on one of the printed circuit layers on which the transmitting line for the at least one clock signal is disposed, the transmitting line for the at least one clock signal should be spaced from the second transmitting line.

In the active matrix type liquid crystal display device having a plurality of switching elements disposed in the panel, the first plurality of electrodes may either apply switching signals to the switching elements (behave as gate lines), or apply voltages to terminals of the switching elements (behave as data lines).

These and other objects, features and advantages of the present invention will become more apparent from the following description when taken in conjunction with the accompanying drawings.

BRIEF DESCRIPTION OF THE DRAWINGS

FIG. 1 is a schematic diagram showing a conventional liquid crystal display having a liquid crystal panel and multilayer printed circuit boards arranged in the liquid crystal panel;

FIGS. 20(a) to 20(f) are plan views of the laminated structure of the multilayer printed circuit board based on the embodiment of FIG. 17 having six stages (printed circuit layers), the first stage (having a TCP-connection surface) to the sixth stage are shown in order;

DETAILED DESCRIPTION

Figure 5:
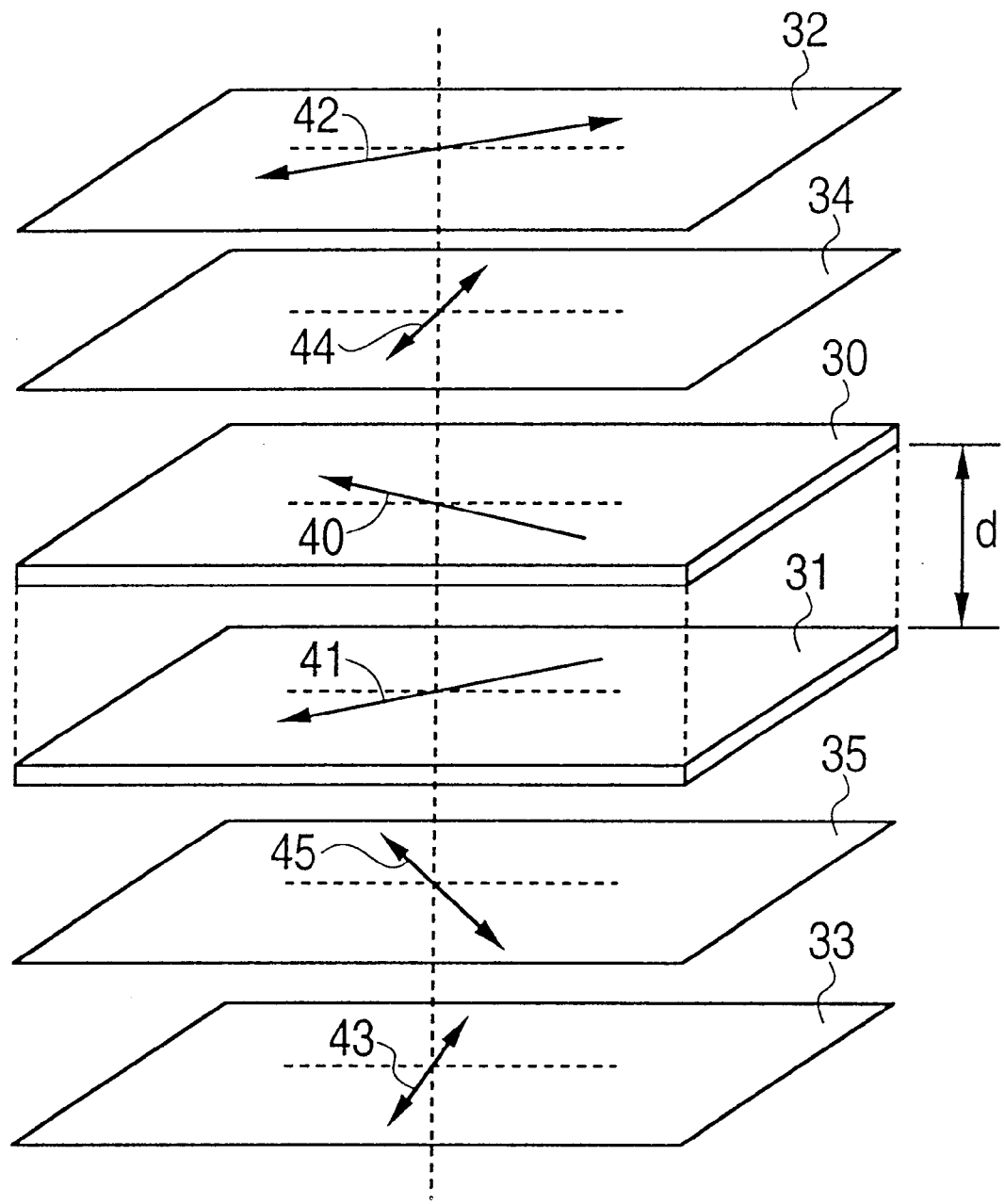
FIG. 5 is an explanatory diagram showing the optical arrangement of the liquid crystal display to which the present invention is applicable.

FIG. 5 is an explanatory view showing an optical arrangement of the liquid crystal display according to the present invention in relation to a passive matrix type liquid crystal display device. The liquid crystal layer is sealed in a cell gap d between an upper substrate 30 and a lower substrate 31, and a pair of phase difference films 34, 35 and a pair of polarizing plates 32, 33 are arranged to hold the cell formed by the upper and the lower substrates 30, 31. The interfaces of the upper substrate 30 and the lower substrate 31 with the liquid crystal layer are provided are attached with alignment layers of high polymer film whose rubbing directions 40, 41 are set as shown to define a twist angle θ of liquid crystal molecules forming the liquid crystal layer.

Figure 6:
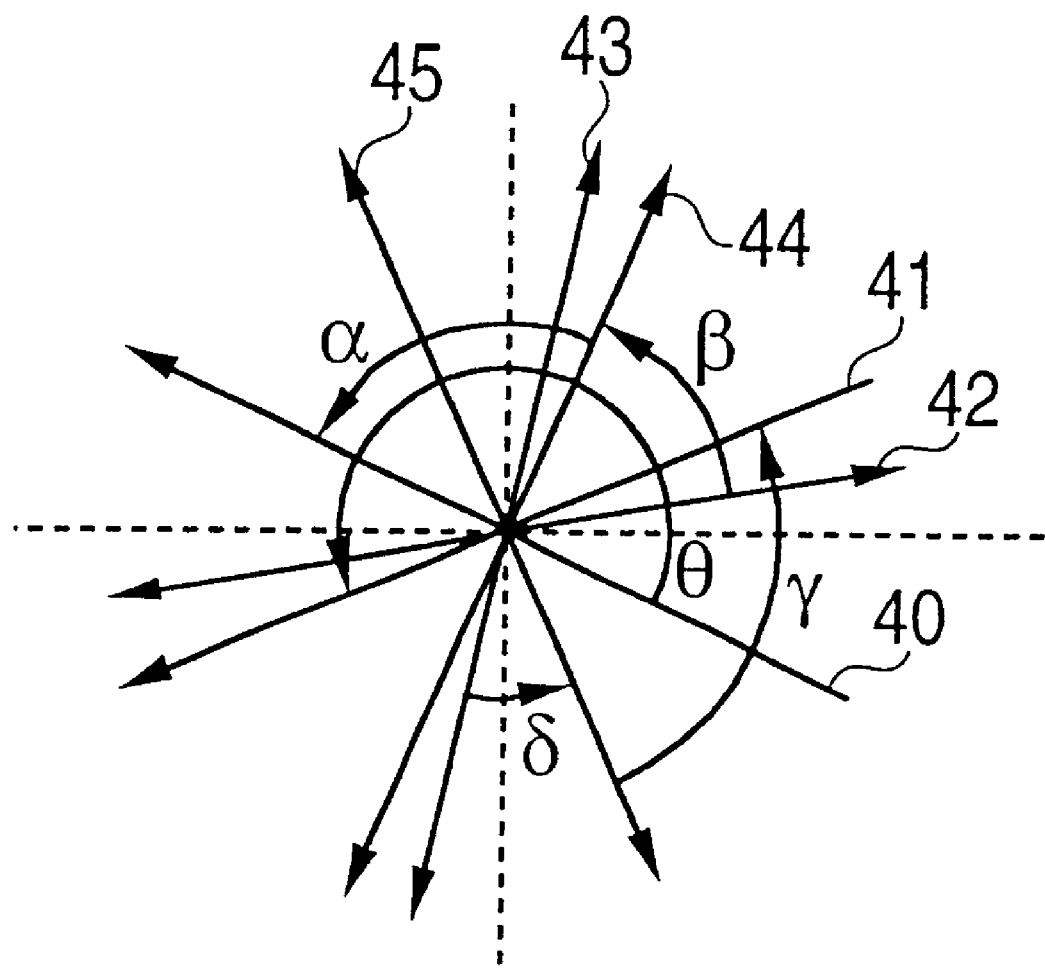
FIG. 6 is an explanatory diagram showing the relation between adjacent rubbing directions and optical axes of constitutional members in the optical arrangement of the liquid crystal display to which the present invention is applicable.

FIG. 6 is an explanatory diagram showing the relation between the adjacent rubbing directions and the optical axes of respective members of the optical arrangement of the liquid crystal display according to this invention.

As shown in FIG. 6, the alignment layers are arranged so that the rubbing directions are laterally symmetrical in the horizontal direction of the liquid crystal panel with the twist angle θ of 230–260 degrees. The phase difference films 34, 35 are arranged so that their optical axes 44, 45 are at angles α, γ of 40–90 degrees (preferably 70–90 degrees) to the adjacent rubbing directions 40, 41. The polarizing plates 32, 33 are so arranged that their polarizing axes 42, 43 are at angles β, δ of 20–70 degrees (preferably 30–60 degrees) to the optical axes 44, 45 of the adjacent phase difference films 34, 35.

Figure 7:
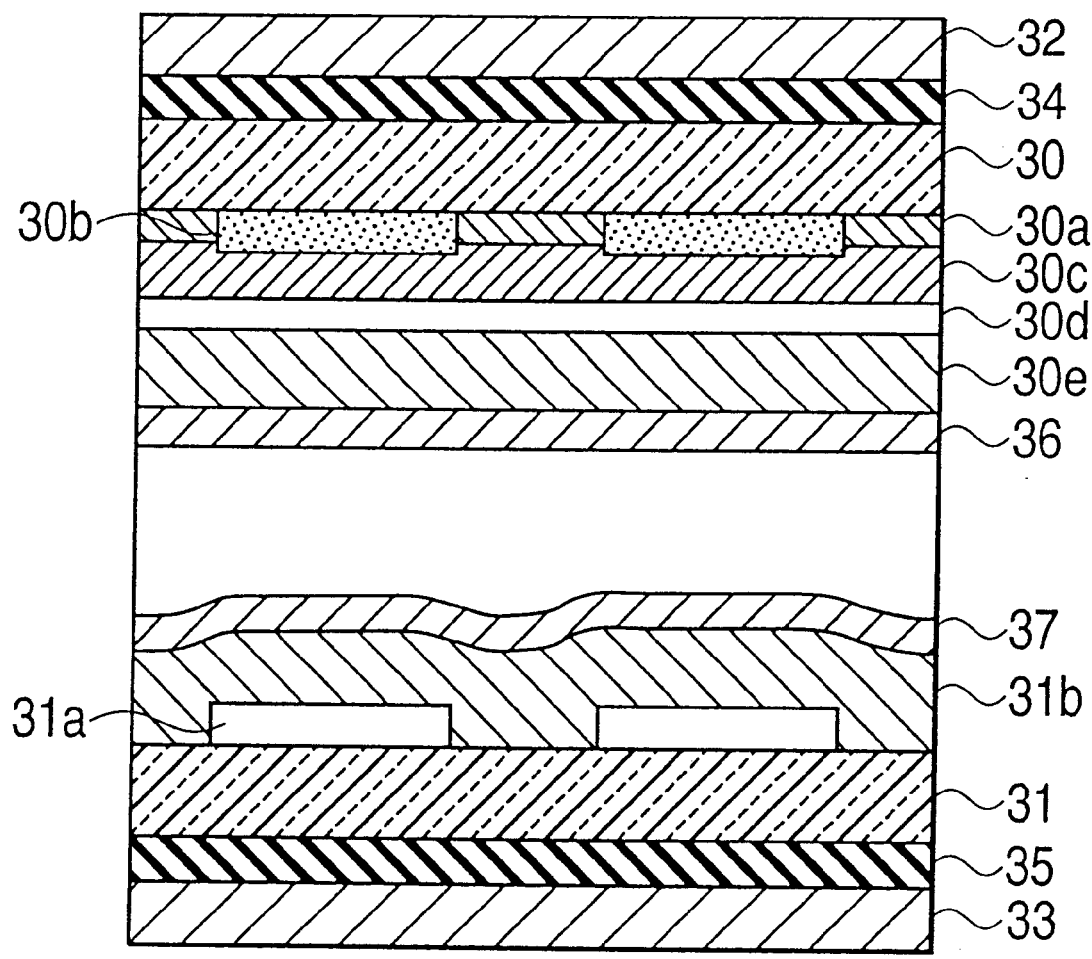
FIG. 7 is a cross section of a portion of the liquid crystal display to which the present invention is applicable.

FIG. 7 is a schematic cross section showing a portion of an example construction of the liquid crystal display of the present invention when applied to a color liquid crystal display. A plurality of color filters 30b circumscribed by a light shielding film (black matrix) are formed on a lower surface of the upper substrate 30. A smoothing layer 30c is formed over the color filters 30b, after which one of the transparent electrode groups 30d (for example, segment electrodes) is patterned over the smoothing layer. Over the transparent electrodes are formed a protection layer 30e and then an alignment layer 36. The other transparent electrode group 31a (for example, common electrodes) is formed on the inner or upper surface of the lower substrate 31. Over the transparent electrodes is formed a protection layer 31b followed by an alignment layer 37.

Figure 8:
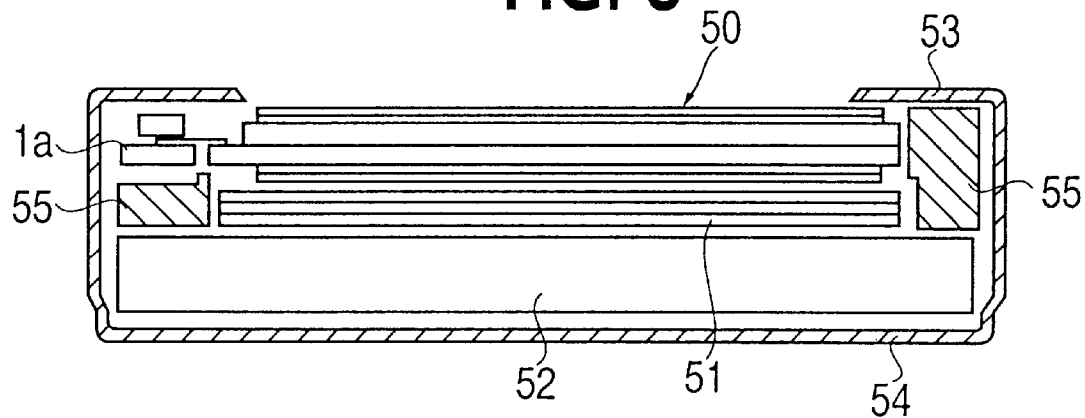
FIG. 8 is schematic cross section of an entire liquid crystal display having a back light integrally built into it along with a liquid crystal panel.

FIG. 8 is a schematic cross section showing the entire liquid crystal display with an internal a backlight for the liquid crystal panel. The liquid crystal panel 50 in this liquid crystal display is laminated over a backlight 52 with an optical film 51 such as prism sheet and light scattering plate interposed therebetween. These members are assembled onto an intermediate frame 55 in a predetermined relationship and are integrally held between an upper frame 53 and a lower frame 54.

Figure 9:
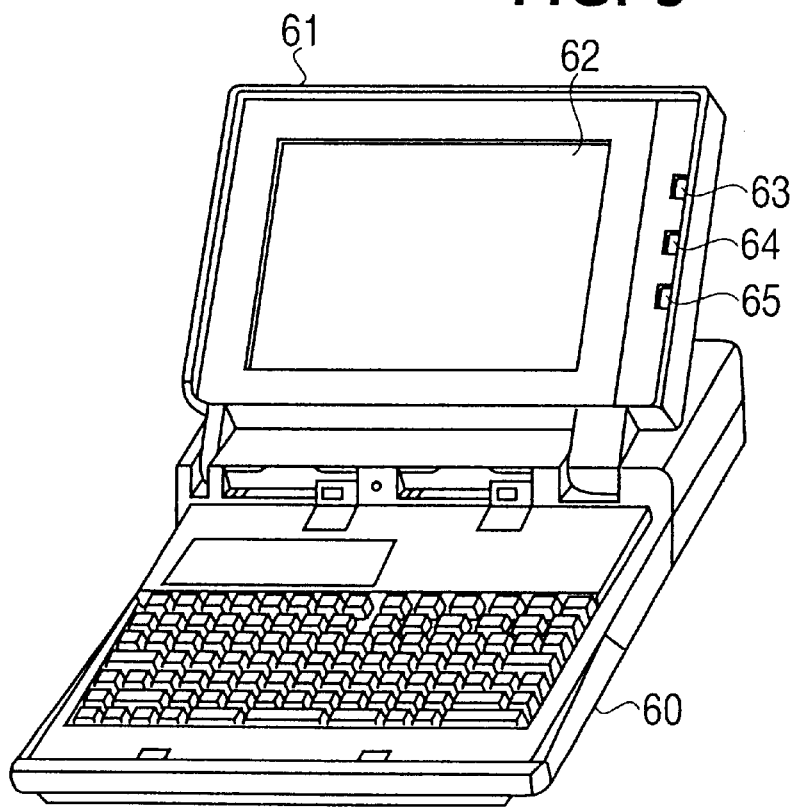
FIG. 9 is a perspective view of a laptop personal computer as an example of an electronic apparatus incorporating the liquid crystal display of the present invention.

FIG. 9 is a perspective view of a laptop personal computer as one example of an electronic apparatus incorporating the liquid crystal display of this invention, wherein the laptop personal computer comprises a body section 60 and a monitor section 61. The monitor section 61 mounts the liquid crystal display of the present invention to display images on a liquid crystal panel 62. Reference number 63 denotes a brightness dial, 64 a contrast dial, and 65 a reversion switch between the display background and the image.

The cross section shown in FIG. 8 corresponds to a cross section image of the monitor section 61 in FIG. 9 taken horizontally around its center. As FIGS. 8 and 9 show, the aforementioned multilayer printed circuit boards are disposed within the monitor section.

Figure 10:
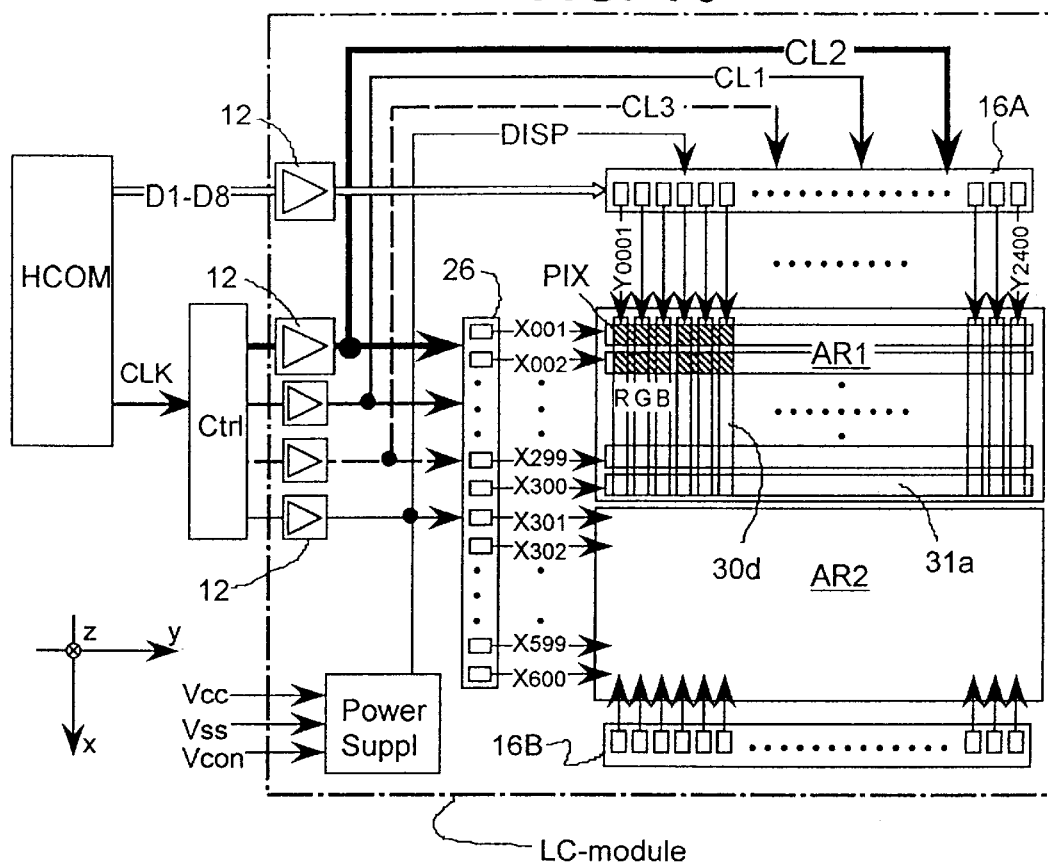
FIG. 10 is a system block diagram showing the signal flows in a liquid crystal module.

The liquid crystal panel is provided with multilayer printed circuit boards 1a, 1b, and 2 to form the liquid crystal display module (abbreviated as LC module, hereinafter). The system of these clock signal lines fed to the LC-module is shown as a block diagram in FIG. 10. FIG. 10 shows the liquid crystal display device of SVGA-grade in the standard of displaying definitions, which has 800 pixels along the common electrodes 31a (y-direction according coordinates shown in FIG. 10) and 600 pixels along the segment electrode 30d (x-direction). For displaying color images, each of the 800 pixels have three kinds of elements (Red, Green, and Blue elements), so that 2400 segment electrodes are provided. A pixel unit having these three elements is shown as a hatched area PIX in FIG. 10.

Furthermore, the screen area is divided to the upper half AR1 and the lower half AR2 as shown FIG. 10, and each screen area has 2400 segment electrodes and 300 common electrodes, respectively. Therefore, both the segment drivers 16A for the upper half and the segment drivers 16B for the lower half are required. For simplified illustration purposes, FIG. 10 shows the respective segment drivers 16A1 to 16AN, and the respective segment drivers 16B1 to 16BN as 16B. Both of the respective segment drivers 16A1 to 16AN and 16B1 to 16BN as shown in FIG. 1 as blocks 16A and 16B, respectively. For simplifying the block diagram, FIG. 10 shows the system of the clock signal lines CL1, CL2, CL3 related to the upper half of the liquid crystal display device only, but these clock signal lines and a display reset signal line DISP (explained later) output from the buffer circuit 12 are also distributed to the segment drivers 16B and a part of the common drivers 26 corresponding to the lower half of the screen area.

In this example, the line clock signal CL1, the pixel clock signal CL2, and the frame clock signal CL3 are generated by the LC-module controller Ctrl. The LC-module controller generates these clock signals, for example, by dividing a other clock signal CLK provided by a host computer HCOM which is provided in the body section 60 of the laptop computer shown in FIG. 9.

The LC-module controller Ctrl may be either a part of the LC-module or a separate unit according to a design of the LC-module. As FIG. 10 shows the LC-module enclosed within the dot-dash outline and the LC-module controller Ctrl is separate from the LC-module. Thus, the connector 11 as shown in FIG. 1 (not shown in FIG. 10) is disposed between the LC-module controller Ctrl and the buffer circuits 12 for the signal lines CL1, CL2, CL3, and DISP. The buffer circuit 12 amplifies the signal power corresponding thereto so as to provide sufficient signal power as to operate the segment and common drivers.

The host computer HCOM also supplies image signals (called, video signals, or pixel signals, also) D1 through D8 for the segment drivers 16A. In contrast to the clock signals, the image signals supplied to the segment drivers 16A and those supplied for the segment drivers 16B are different from each other, but are generated in the host computer in a manner 16A corresponding to the clock signal CLK. Although not shown in FIG. 10, the other signal lines for supplying the image signals for the segment drivers 16B are disposed in the same manner as that for the segment drivers 16A.

In the segment driver 16A, eight kinds of the image signals D1, D2, D3, D4, D5, D6, D7, and D8 are supplied for every eight driver units respectively. The driver units are disposed within the segment driver 16A and control voltage applied to the segment electrodes 30d one by one. In FIG. 10, there are 2400 segment electrodes along the segment drivers 16A, thus 2400 of the driver units are disposed therein.

Assuming ten of the segment drivers 16A1 to 16AN (here, N=10) in FIG. 1 are provided for the upper screen area AR1 of FIG. 10, each of the segment drivers has 240 of the driver units therein. On the other hand, the image signals are supplied by eight signal lines in FIG. 10. Transmitting the image signals with N signal lines is called an "N-bit transmission mode of the image signals". Thus, FIG. 10 exemplifies an eight bit signal transmission mode. According to the assumption, each of the segment drivers 16A has to receive the image signals for 240 segment electrodes corresponding thereto from the 8 bits signal transmission lines. Therefore, the segment driver acquires 8 signals 30 times in a predetermined period.

Figure 11:
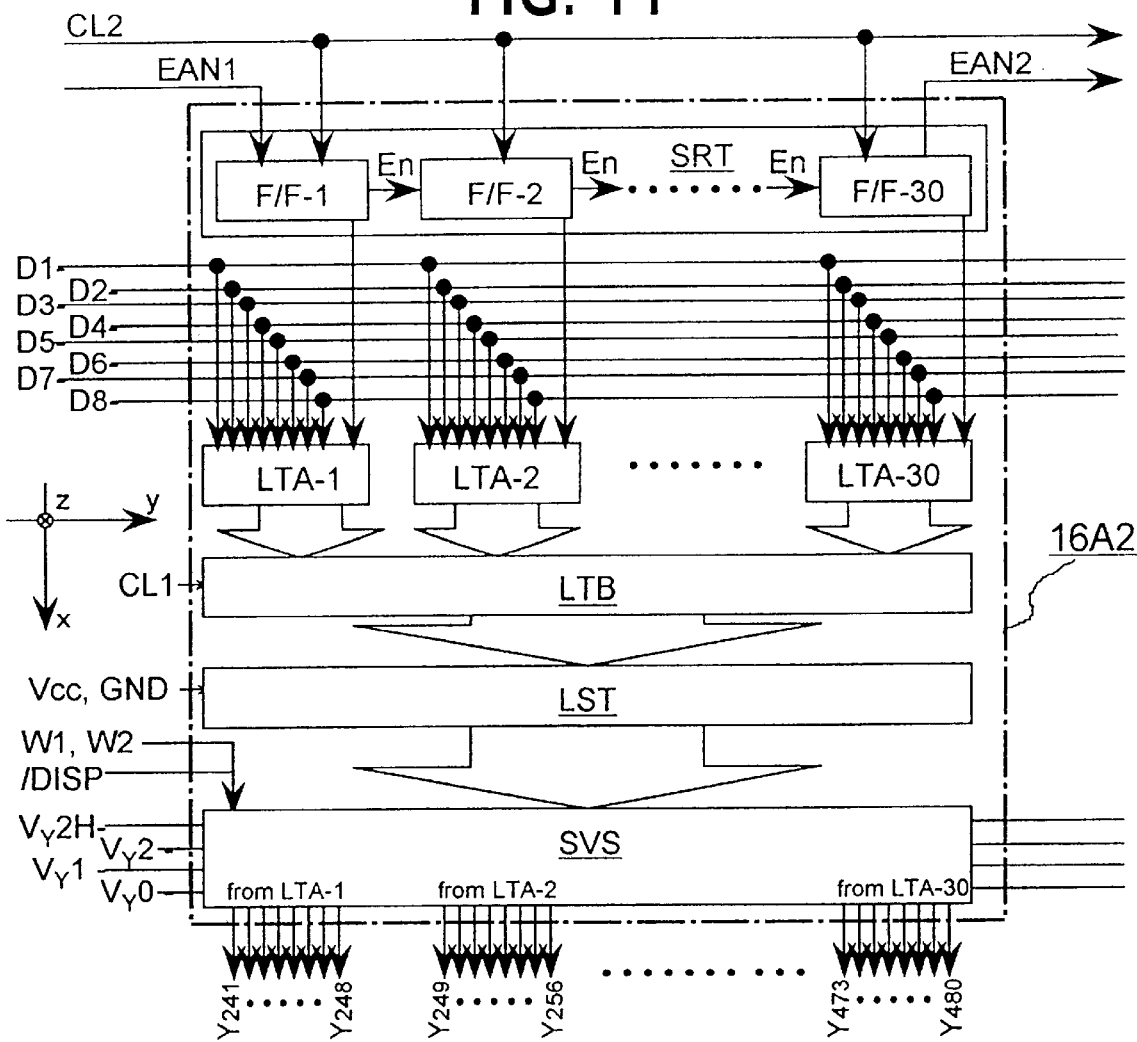
FIG. 11 is the block diagram of the signal flow in the segment driver.

FIG. 11 is an explanatory diagram based on one of the segment drivers 16A1 to 16AN in FIG. 1. FIG. 11 exemplifies the segment driver 16A2 specifically, but the other segment drivers also have the same structure except for the address numbers of the segment electrodes corresponding thereto. The constitution of the segment driver is shown in an enclosed region within the dot-dash outline in FIG. 11.

The image signal lines D1 to D8 and segment voltage lines $V_{Y0}$, $V_{Y1}$, $V_{Y2}$, and $V_{Y2H}$ passing through this region are disposed on the multilayer printed circuit board 1a, and signals or voltages of these lines are fed through the tape carrier pad 15A2 to the segment driver 16A2.

In FIG. 11, 8 bits of the image signals are acquired by the first latch circuits denoted as LTA-1 to LTA-30 sequentially. Arrows connecting each of the image signal lines with the respective first latch circuits correspond to the aforementioned driver units. Each acquisition of 8 bits 16A signal by the first latch circuits are controlled by the shift register SRT disposed within the segment driver 16A2. The shift register SRT has flip-flop circuits F/F-1 to F/F-30 corresponding to the first latch circuit LTA-1 to LTA-30.

Figure 12:
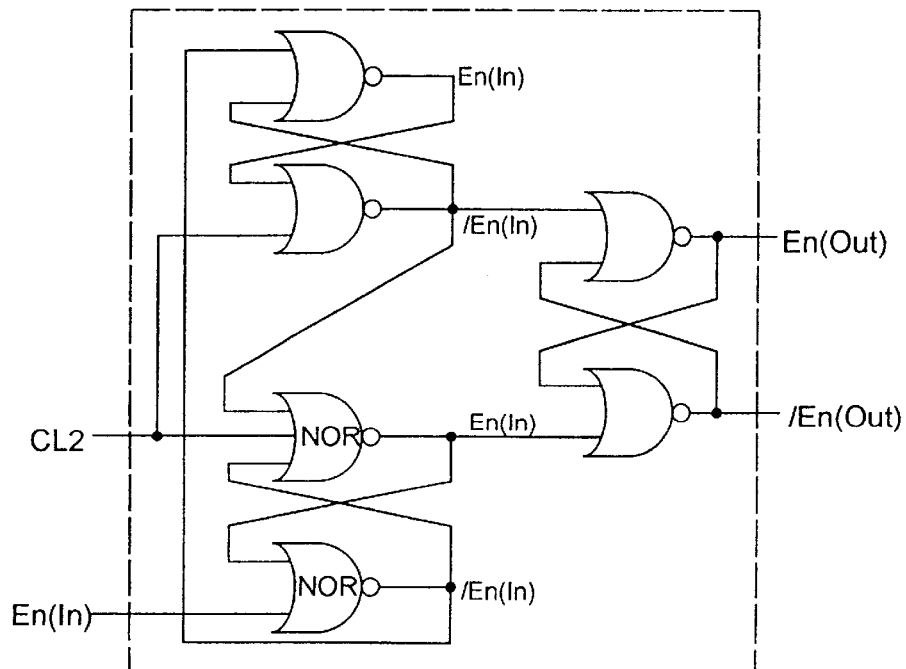
FIG. 12 is the logic circuit of the D flip-flop circuit used in the shift register of the segment driver.

Each of the flip-flop circuits comprises, for example, a negative edge-triggered D flip-flop combined with a plurality of NOR elements, as shown in FIG. 12, and the shift register SRT comprises a cascade of a plurality of the flip-flop circuits. The flip-flop circuit may utilize a type other than the D flip-flop, and the cascading of the plurality of flip-flop circuits may be replaced by counters or a combination with decoders, for example. Such sequential logic circuits suitable for the shift register SRT are disclosed, for example, in R. H. Katz "Contemporary Logic Design" (The Benjamin/Cummings Publishing Company Inc.) pages 295–301 and 330–356.

Assuming each of the flip-flop F/F-1 to F/F-30 in FIG. 11 is the D flip-flop of FIG. 12, an enable signal of High-state ("1") from the segment driver 16A1 via an enable signal line ENA1 enters the port En(In) of the flip-flop circuit F/F-1, and then the pixel clock signal CL2 transits from High-state to Low-state ("0"), consequently the output of En(Out) of the flip-flop circuit F/F-1 provides a High-state signal. Simultaneously, its inverted output /En(Out) provides a Low-state signal. Assuming that the first latch circuit LTA-1 acquires the image signals according to the High-state signal from the output En(Out) of the flip-flop circuit F/F-1 corresponding thereto, the only first latch circuit LTA-1 can acquire the image signals for its corresponding segment electrode $Y_{241}$ to $Y_{248}$ at this time, but the other first latch circuits LTA-2 to LTA-30 cannot. After outputting High-state signal from the port En(Out), the flip-flop circuit F/F-1 does not provides High-state from its output port En(Out), until next enable signal of High-state comes to its input port En(In). Until this first flip-flop circuit F/F-1 provides the next High-state output for the first latch circuit LTA-1, its signal acquisitions are suspended.

In FIG. 11, the High-state signal from the port En(Out) of the flip-flop circuit F/F-1 enter the port En(In) of its following flip-flop circuit F/F-2. Then, at the next High-to-Low transition of the pixel clock signal causes, the flip-flop circuit F/F-2 provides the High-state signal from its port En(Out) for the first latch circuit LTA-2 corresponding thereto. At this time, only the first latch circuit LTA-2 can acquire the image signals for its corresponding segment electrode $Y_{249}$ to $Y_{256}$, and the other first latch circuits cannot.

Repeating these procedures, the image signals acquisitions are performed from the first latch circuit LTA-1 to the first latch circuit LTA-30 sequentially in response to High-to-Low transitions of the pixel clock signal CL2 in the segment driver 16A2. The High-state signal output from the flip-flop circuit F/F-30 is sent to the following segment driver 16A3 via another enable line ENA2, and enters its flip-flop circuit F/F-1.

As the other segment drivers 16A1 and 16A3 to 16A10 have substantially the same circuit as that of the segment driver 16A2, the image signals provided by the signal lines D1 to D8 are acquired by the respective first latch circuits from LTA-1 in the segment driver 16A1 to LTA-30 in the segment driver 16A10 for every 8 segment electrodes along y-axis sequentially (i.e., time divisionally). These image signals are stored regardless of the acquisition time thereof in the driver units in the respective first latch circuits LTA. After the final signals acquisition for $Y_{2393}$ to $Y_{2400}$ is finished, the line clock signal CL1 transits from the High-state to the Low-state. This High-to-Low transition of the line clock signal CL1 turns on a second latch circuit LTB in FIG. 11 and provides all of the stored image signals for the segment electrodes $Y_{0001}$ to $Y_{2400}$ for a level shifter LST. The level shifter LST amplifies these video signal sufficient by operate a segment voltage supply SVS. Finally, the segment voltage supply SVS selects one voltage from the voltages provided by segment voltage lines $V_{Y0}$, $V_{Y1}$, $V_{Y2}$, and $Y_{Y2H}$ for each of the segment electrodes $Y_{0001}$ to $Y_{2400}$ according to the signal output from the level shifter LST corresponding thereto, and applies each selected voltage to each segment electrode.

Figure 13:
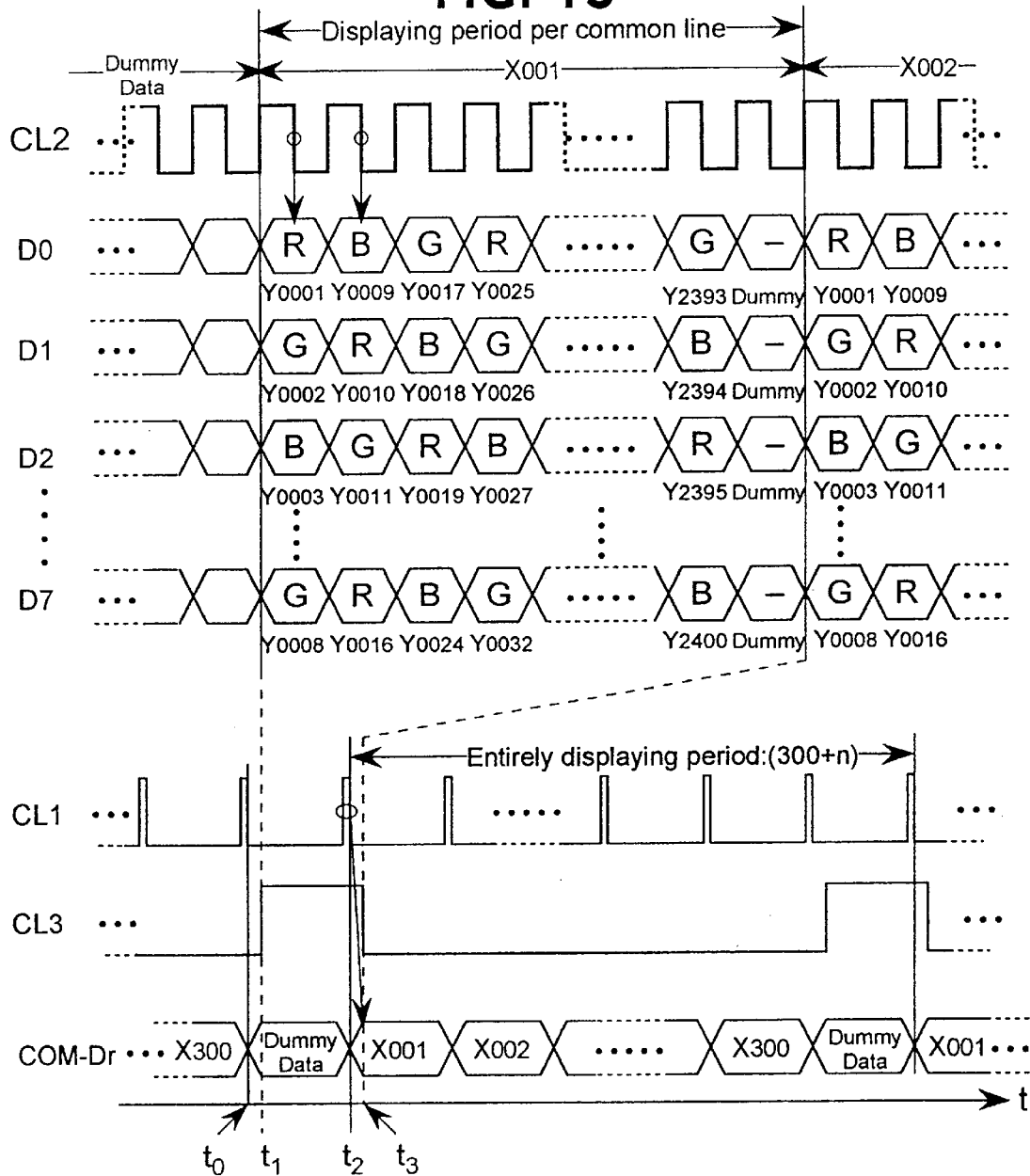
FIG. 13 is the waveform chart of the clock signals and the image signals.

The above mentioned procedures of the image signal acquisitions and the voltage applications to the segment electrodes are further explained by the signal waveforms shown in FIG. 13 representing an entire operation of the liquid crystal display device. In FIG. 13, the time axes (abscissa) for the upper five waveforms are expanded in contrast to those for the lower three waveforms.

As shown in FIG. 13, each of the clock signals CL1, CL2, and CL3 has a waveform alternating its state between High (H) and Low (L) in a predetermined period. Therefore, each of the clock signals has a frequency defined, for example, by an interval between times of successive High-to-Low transitions thereof. Usually, the frequency f2 for the pixel clock signal CL2 is the highest, and the frequency f3 for the frame clock signal CL3 is the lowest in those three frequencies f1, f2, and f3.

On the other hand, each of the image signals D1 to D8 has a pattern according to a plurality of pixel information. FIG. 13 shows waveforms for D1 to D3 and D8 only, but the other image signals also have similar waveforms thereto. Each of the waveforms D1 to D3 and D8 is shown as a succession of hexagons corresponding the waveform of CL2. This succession means a possibility that the image signal can take either High-state or Low-state in a predetermined period. Therefore, for example of the signal D1, when all of the image signals for the segment electrodes $Y_{0001}$, $Y_{0009}$, and $Y_{0017}$ are in High-state and the image signal for the segment electrode $Y_{0025}$ is in Low-state, the image signal D1 corresponding to the first three pulses of CL2 from time $t_1$ remains at High-state.

The image signal acquisitions for all of the segment electrodes $Y_{0001}$ to $Y_{2400}$ are completed within a period from $t_1$ to $t_3$. Actually, each of the first latch circuits LTA in the segment drivers 16A has already stored the signals for the segment electrodes corresponding thereto, at a time $t_2$. At a time $t_2$, the clock signal to CL1 also transits 30 from High-state to Low-state so that the second latch circuit LTB permits the signal transmissions from the first latch circuits LTA to the segment voltage supply SVS. Then, all of the voltages according to the respective image signals stored by the first latch circuits are applied to the respective segment electrodes corresponding thereto. Simultaneously, a predetermined voltage is applied to the common electrode $X_{001}$. According to voltage differences between each of the segment electrodes $Y_{0001}$ to $Y_{2400}$ and the common electrode $X_{001}$, the image appears in a part of the screen area AR1 corresponding to the common electrode $X_{001}$. After the time $t_3$, the next sequence of the image signals acquisitions corresponding to the common electrode $X_{002}$ starts. For adjusting timings of the image signal acquisitions and the voltage application to the common electrodes, each waveform of the signals D1 to D3 and D8, and the common driver control COM-Dr has dummy periods which do not contribute the image display directly.

As explained above, the image signal acquisitions are repeated as many times as the number of the common electrodes, and then whole image of the screen area AR1 is completed. The procedure of the image signals acquisitions for each of the common electrodes is called "scanning" and such a voltage as applied to the common electrode is called "scanning voltage" also. The line clock signal CL1 distributes each voltage for each of the common electrodes $X_{001}$ to $X_{300}$ in a similar manner to that for the segment electrodes by the pixel clock CL2.

Figure 14:
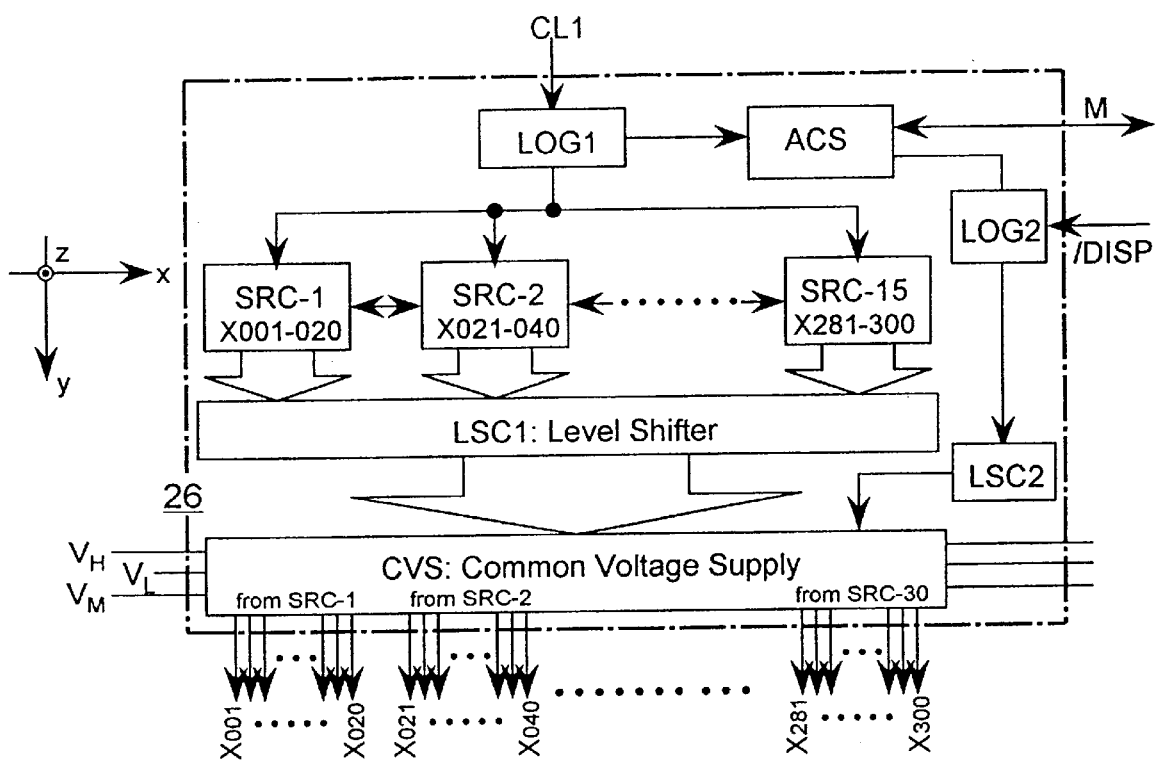
FIG. 14 is the block diagram of the signal flow in the common driver.

FIG. 14 shows a block diagram of the common driver 26. The clock signal CL1 enters the first logic circuit for controlling an alternating signal generator ACS, and is also distributed to each of shift registers SRC-1 to SRC-15. These shift registers appear similar to the shift register SRT in the respective segment driver, but differ in their function of transmitting enable signals co-directionally. The signal flows from the shift registers SRC-1 to SRC-15 to a common voltage supply CVS through a level shifter LSC in a manner similar to those of the segment driver except that the latch circuit operated by a clock signal other than that for the shift registers is not disposed between the shift register SRC and the level shifter LSC. Therefore, as soon as a driver unit in one of the shift registers outputs a signal for its corresponding common electrode, a predetermined voltage is applied to this common electrode. As the common voltage are applied to the respective common electrode $X_{001}$ to $X_{300}$ in such manner mentioned above, times for applying the common voltages are different from each other.

On the other hand, the frame clock signal CL3 has pulses corresponding to the whole image display, and its pulse appears at the period when a pulse of the clock signal CL1 related to the common electrode $X_{001}$ to which a voltage is applied at first during the sequence of the whole image display. Therefore, the clock signal CL3 is also called "first line marker".

According to the pulse of the frame clock signal CL3, the aforementioned segment driver 15A1 starts the image signals acquisition for the first 8 segment electrodes $Y_{0001}$ to $Y_{0008}$ in response to the first High-to-Low transition of the pixel clock signal CL2, and the first High-to-Low transition of the line clock signal CL1 applies voltages to the segment electrodes $Y_{0001}$ to $Y_{2400}$ and the common electrode $X_{001}$. Therefore, a displaying operation of the liquid crystal display device depends on the timings of the three clock signals CL1, CL2, and CL3. In this exemplified liquid crystal display device, both the first multilayer printed circuit boards 1a, 1b and the second multilayer printed circuit board 2 have signal lines for the three clock signals to the segment or common drivers. The three signal lines are supplied from the signal line in the multilayer printed circuit board to the tape carrier pad mounting the segment or common driver thereon.

Figure 2A:
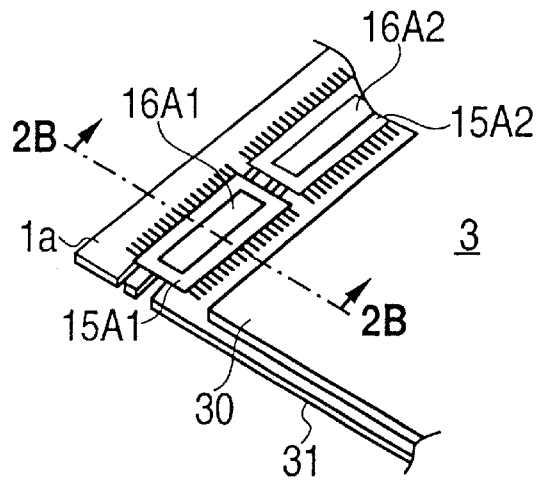
FIGS. 2(a) and 2(b) are a schematic diagram showing the configuration of the conventional multilayer printed circuit board on the segment side and its cross section when along line 2B—2B.
Figure 2B:
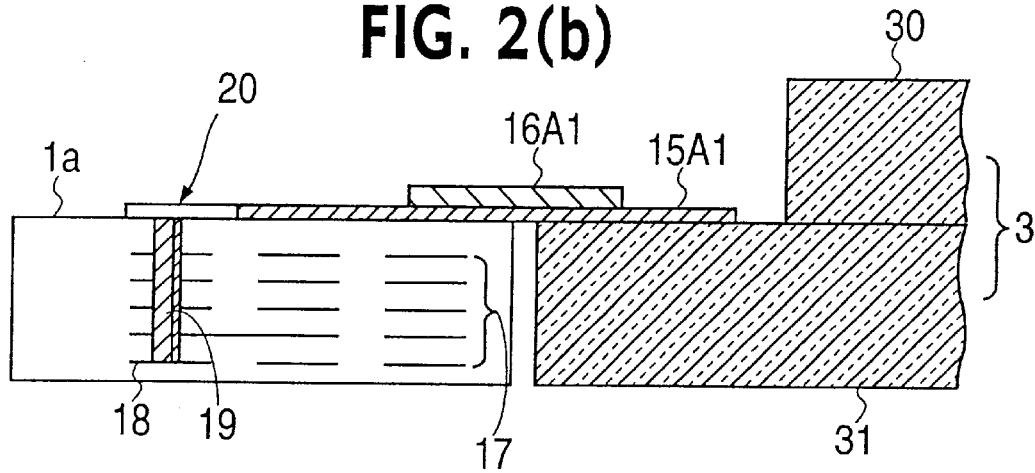
Figure 3:
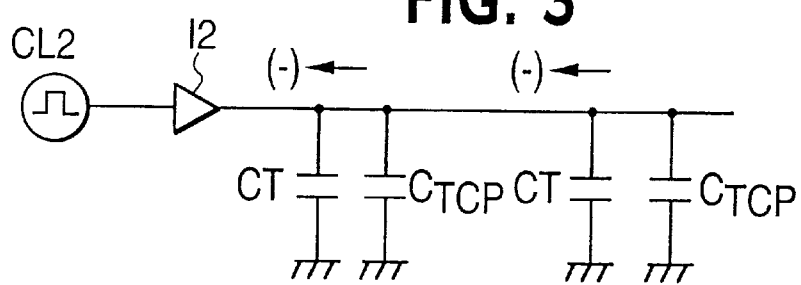
FIG. 3 is an equivalent circuit of the clock wire.
Figure 15A:
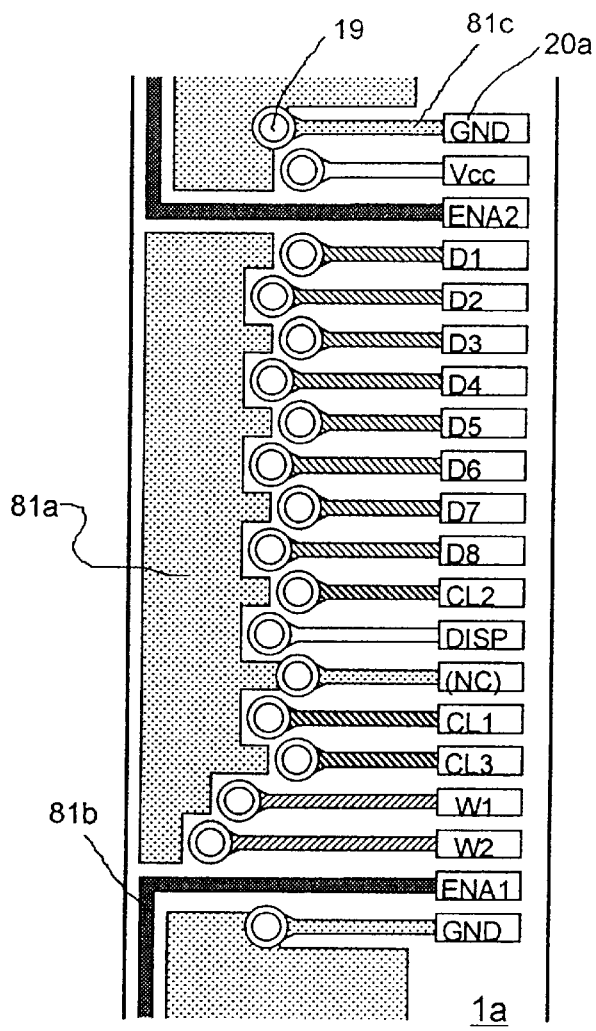
FIG. 15(a) is an enlarged image of the TCP-connection surface of the multilayer printed circuit board.
Figure 15B:
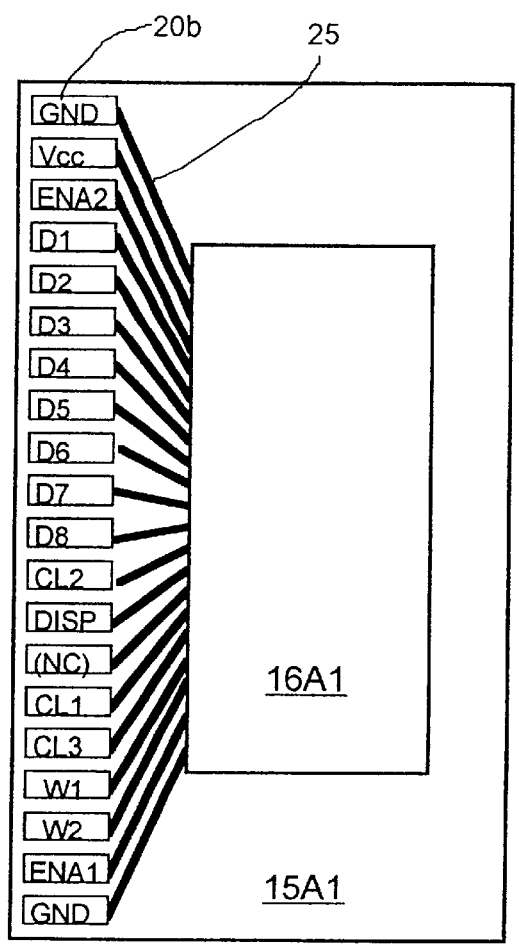
FIG. 15(b) is an enlarged image of the TCP having terminals corresponding to those on the TCP-connection surface of FIG. 15(a)

FIGS. 15(a) and 15(b) shows an enlarged image of both connection portions of the first multilayer printed circuit board 1a (partially) and the tape carrier pad 15A1 of FIGS. 2(a) and 2(b). FIG. 15a is a plan view of an upper wiring layer of the first multilayer printed circuit board (called "the connected surface of the TCP"), and a plurality of terminals 20a are disposed thereon. Each of these terminals 20a are connected with one of the terminals 20b formed on the tape carrier pad 15A1 by solder or anisotropic conductive film corresponding thereto. Signals and voltages supplied by the respective wiring layers in the first multilayer printed circuit board 1a pass through the leads 25 and enter the segment driver 16A1 in FIG. 15(b). Most of the terminals 20a have conductive layers 81c terminated by the through hole 19. The enable signals are only transmitted to the other segment drivers by their own signal lines 81a on this layer. The terminals for the ground potential (GND) and not for use (NC) are connected to a conductive layer 81b interrupted in the y-direction. This conductive layer 81b are formed for preventing electromagnetic interferences (i.e., EMI) from/to the signal lines disposed in the first multilayer printed circuit board. Considering the EMI, the clock signal lines are disposed near the opposite side of the multilayer printed circuit board to the connected surface of the TCP, and a plurality of the wiring layers are laminated as shielding layers therebetween.

As FIG. 15 shows, there are many kinds of lines other than the clock signal lines CL1, CL2, CL3 laid in the first multilayer printed circuit board 1a. In this example, the other wiring lines in the multilayer printed circuit board are classified as follows:

Group 1: Image Quality Control Lines W1, W2;
Group 2: Enable Signal Lines ENA1, ENA2;
Group 3: Display Reset Signal Line DISP; and
Group 4: Driver Voltage Line Vcc, Segment Voltage Lines $V_{Y0}$, $V_{Y1}$, $V_{Y2}$, $V_{Y2H}$, Ground Potential Line GND.

In comparison with the clock signals CL1, CL2, CL3, the lines of group 4 are quite different from the lines of the clock signals in their purpose. Each wiring line of the group 4 does not transmit any kind of signals but rather supply electric power for operating electrodes in the liquid crystal display panel or its driving circuit. Therefore, even if spurious signal are accidentally superimposed on such wiring lines by EMI from its peripheral circuits, the potential of these wiring lines of group 4 can be regard as stable. Group 4 includes the ground potential line GND, because the ground potential can be regard as one of the electrical potential. In the block diagram of FIG. 14, the common voltage lines $V_M$, $V_L$, and $V_H$ belong to this group.

Display Reset Signal (DISP) in the group 3 is a signal but does not change its status during the image signals acquisitions by the segment drivers defined as a period between $t_1$ and $t_2$ in FIG. 13. Thus, the potential of the Display Reset Signal line can be regard as stable during this period. Signals having such character as that of the DISP are transmitted by a wiring line classified as the group 3.

As mentioned above, the enable signal changes its state (High or Low) according to the image signals acquisition, but its change appears locally along the arrangement of the segment drivers, because the enable signal lines ENA1, ENA2 must connect the segment drivers (their shift registers or like) in series, in contrast to the pixel clock signal CL2 which is distributed in parallel to these segment drivers. Therefore, in the case of disposing plural the segment drivers along the extension direction (y) of the multilayer printed circuit board and connecting the respective enable signal lines in series, the potential of the entire enable signal line along its extension direction is considered as substantially stable in comparison with the aforementioned three clock signals. The wiring line of group 2 transmits the signal considered as substantially stable because of the difference of its signal path from that of the clock signal. In the view of roles in the sequential logic circuit such as a shift register SRT, the enable signal designates a specific circuit element thereof, but the timing of its operation is predominantly determined by the pixel clock signal CL2, rather than the enable signal.

Image Quality Control Lines W1, W2 transmitted signals generated in the logic controller 13 which receives the pixel clock signal CL2 in FIG. 1. Thus, this signal may change its state in response to the clock signal. However, as shown in FIG. 11, the image quality control signals W1, W2 are not provided for the shift register (as sequential logic), but rather to the segment voltage supply SVS so as to regulate its operational condition. The signal line classified as the group 1 transmits such signals which do not contribute to the image signal acquisition as the image quality control signals. The alternating signal M supplying the generator ACS in FIG. 14 is also transmitted by the wiring line of the group1. The alternating signal M regulates the bias direction between the segment electrodes and the common electrodes, but does not contribute to the scan signal acquisition.

Figure 4:
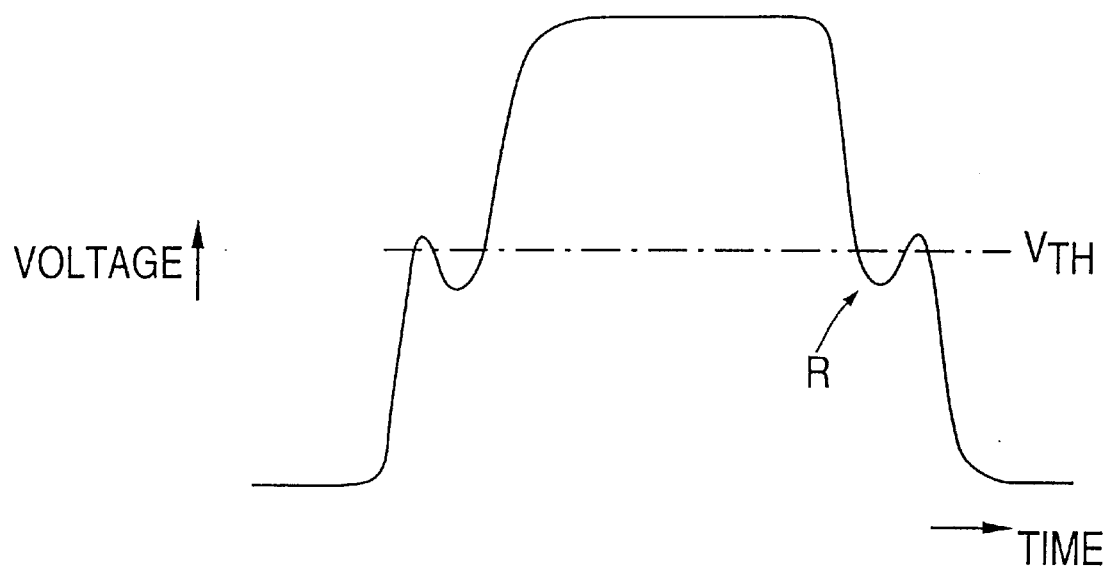
FIG. 4 is a waveform diagram of the pixel clock signal CL2.

The inventors recognized that the signal waveform deformation mentioned with reference to FIG. 4 seriously affects the operation of the sequential logic circuit. Applying the waveform of FIG. 4 to the rectangular pulses of the clock signal waveform CL1, CL2, CL3 in FIG. 13, it is apparent that the waveform deformation of FIG. 4 causes a miscounting problem in timing controls of the logic circuits. The preceding explanation for the miscounting problem is based on the negative edge-triggered logic circuit, but according to the waveform of FIG. 4, this problem also appears in a positive edge-triggered logic circuit (its counting operation regulated by Low-to-High transition of a clock signal). In the preceding explanation, the relationship between the parasitic capacitance in the first multilayer printed circuit board 1a and the waveform deformation of the pixel clock signal CL2 is mentioned, but the parasitic capacitance similar thereto may also appears in the second multilayer printed circuit board 2, and signals other than the pixel clock signal may have a similar problem to that of the pixel clock signal CL2 as long as the signal predominantly controls timing of a circuit operation dominantly.

In the case of the liquid crystal display device of FIG. 1, integrating all of the segment drivers 16A1 to 16AN monolithically or putting them together into a package may be considered to reduce the clock signal feeding portion. By reducing the number of contact holes for feeding the clock signal to the driver circuit, the amount of the parasitic capacitance may be considered to be reduced so that the waveform deformations of the clock signals are sufficiently suppressed. However, considering the size of the liquid crystal display panel, the aforementioned arrangement of monolithic integration requires to fabrications of a semiconductor chip which extends 10 cm or longer. Therefore, this arrangement is not practical according to current technology. The packaging arrangement can be realized but also provides difficulties in the process for mounting the driver circuit in a periphery of the liquid crystal display panel.

Figure 16A:
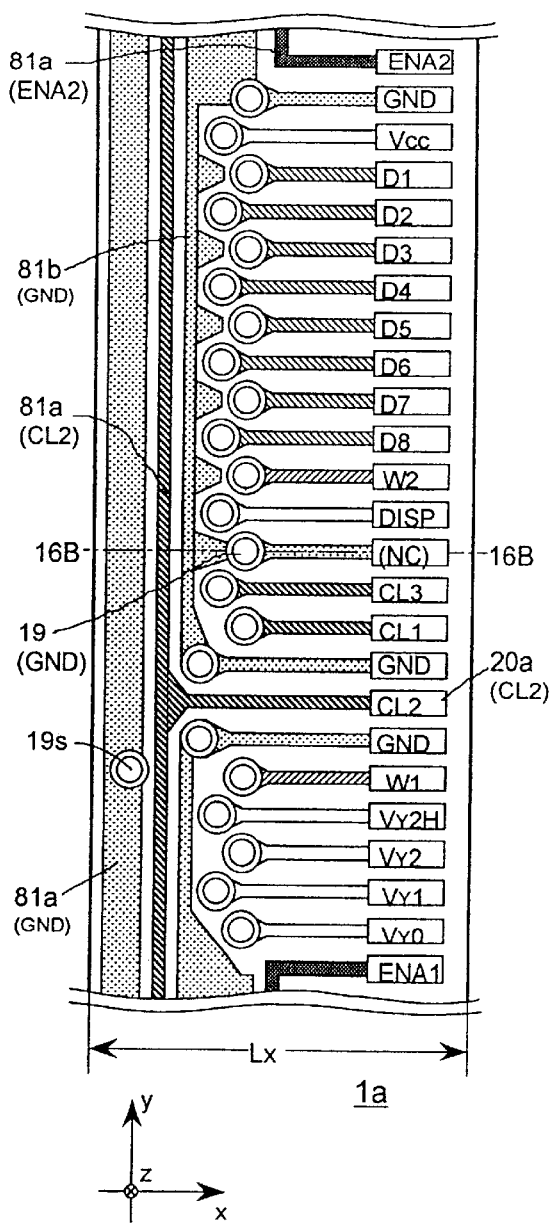
FIG. 16(a) shows one printed circuit board structure suitable for suppressing the waveform deformation of the clock signal CL2.
Figure 16B:
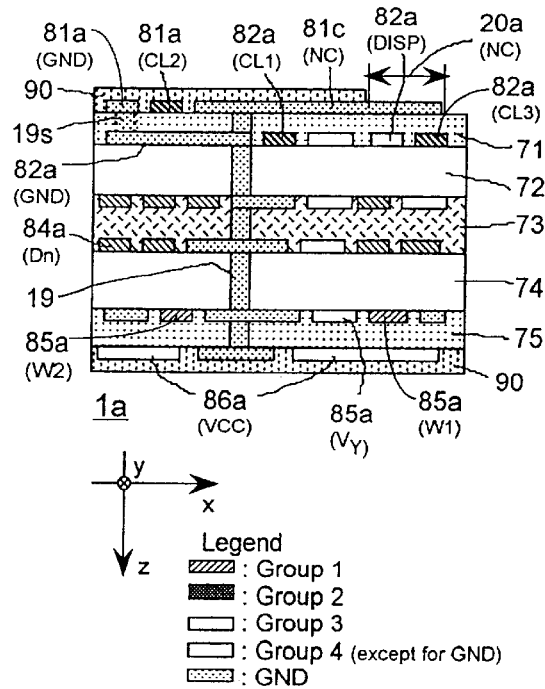
FIG. 16(b) is a cross section-taken along line 16B—16B of FIG. 16(a)

Therefore, the inventors considered the structure of the printed circuit board which generates the aforementioned waveform deformation and provided a structure for suppressing the parasitic capacitance along the clock signal line CL2 as shown in FIGS. 16(a) and 16(b), wherein FIG. 16(b) shows a cross section taken along line 16B—16B in FIG. 16(a).

In FIG. 16(a), the clock signal CL2 is transmitted through the wiring layer 81a (CL2) disposed and extending along the y-direction on the TCP connected surface of the multilayer printed circuit board 1a. According to the preceding explanation, the clock signal CL2 is considered to have priority over the other clock signals CL1, CL3. In this configuration, the wiring layer 81a (CL2) is surrounded by the wiring layer 81a (GND) and the conducting layer 81b (GND) of the ground potential.

As shown in FIG. 16(b), the other wiring layer of the ground potential 82a (GND) is disposed below the wiring layer 81a (CL2). The additional through hole 19s maintains the potential stability of the wiring layer 81a (GND) by connecting it to the other wiring layer 82a (GND). Enclosing the wiring layer for the clock signal CL2 with the ground potential layer stabilizes the potential around the wiring layer 81a (CL2), and reduces the electromagnetic interference (EMI) from and to this wiring layer as well. For this purpose, the layer surrounding the wiring layer 81a (CL2) can be any layer selected from the above mentioned groups 1 to 4, and especially a member of group 4 is recommended.

The cross section as shown in FIG. 16(b) of the multilayer printed circuit board of FIG. 16(a) has six stages. First stage layers including the wiring layer 81a (CL2) are formed on the film 71 covering the glass-epoxy substrate 72 and having through holes. The glass-epoxy substrate 71 is so rigid that the first stage layers are sufficiently fixed. The second stage layers including the wiring layers for the clock signals CL1, CL3 are formed on the upper surface of the glass-epoxy substrate 72, and a third stage layers are formed on lower surface thereof. A fourth stage layers including the wiring layers for the image signals Dn are formed on the upper surface of another glass-epoxy substrate 74, and a fifth stage layers are formed on lower surface thereof. Furthermore, another film 75 formed on the lower surface of glass-epoxy substrate 74, and a sixth stage layers are formed on the lower surface of the film 75. The lower surface of the glass-epoxy substrate 72 is glued to the upper surface of the glass-epoxy substrate 74 by glass fiber into which the epoxy resin permeates. By hardening the epoxy resin in the region 73 between third and fourth stages, the multilayer printed circuit board 1a is completed. The number of stages can be increased by inserting additional glass-epoxy substrates between the glass-epoxy substrates 72, 74. On both the upper surface of the film 71 and the lower surface of the film 75, solder resist layers 90 other than the terminals 20a are provided. By providing the clock signal line CL2 at an upper most layer of the multilayer printed circuit board as shown in FIGS. 16(a) and 16(b), the parasitic capacitance is reduced so that the waveform distortion at R in FIG. 4 is eliminated and a display without flicker is attained.

In FIGS. 16(a) and 16(b), patterns of the respective conductive layers are altered according to the group to which the conductive layers belong. Each conductive layer for the clock signal lines CL1, CL2, CL3 has a common pattern. Each conductive layer for the image signal lines D1 to D8 has another common pattern. Each of the other conductive layers has a pattern classified by the aforementioned four groups other than the ground potential line GND. These indications will be used in the other figures.

A reduction of the frame width of the liquid crystal display device is regarded as an important factor in the production of the current liquid crystal display. Therefore, the width Lx of the multilayer printed circuit board as shown in FIG. 16(a) has to be made as narrow as possible.

Figure 17:
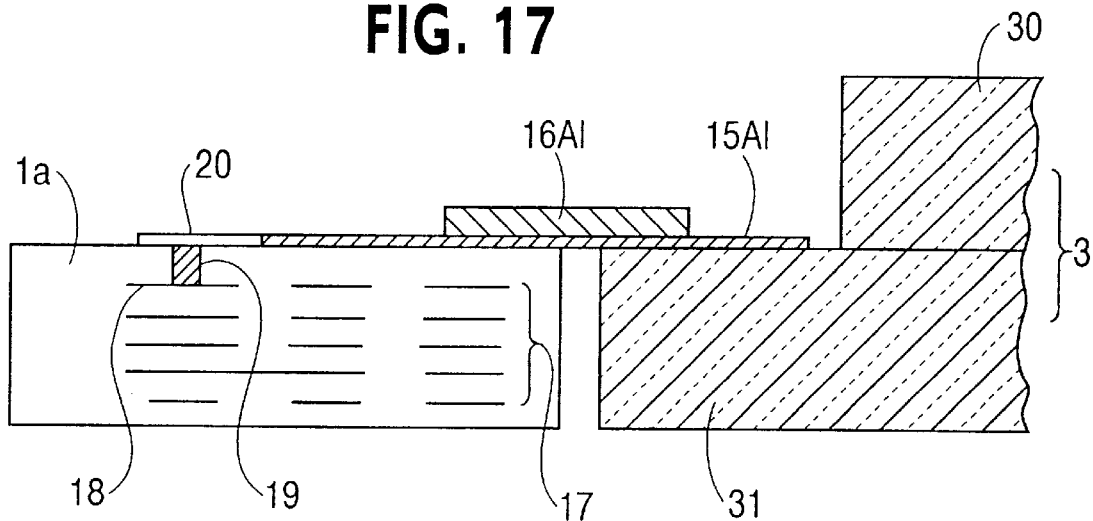
FIG. 17 is a cross section, similar to FIG. 2(b), of the liquid crystal display of one embodiment of the present invention, showing the configuration of the multilayer printed circuit board on the segment side.

To satisfy this requirement without the aforementioned waveform deformation of the clock signal, the inventors considered another structure which is explained with reference to FIGS. 17 to 19, wherein FIG. 17 is a cross section, similar to FIG. 2(b), of one embodiment of the liquid crystal display of the present invention, showing the configuration of the multilayer printed circuit board on the segment side. As in the case of FIG. 2(b), the segment substrate 1a, which is the first multilayer printed circuit board, is arranged on the upper side of the liquid crystal panel 3 and connected to the panel through the TCP 15A1 etc having the segment driver 16A1 etc mounted thereon.

In this embodiment, the wire 18 of the pixel clock signal CL2 laid on the multilayer printed circuit board 1a is arranged on the uppermost layer with respect to the upper surface of multilayer printed circuit board having the TCP 15A1 provided thereon. The pixel clock signal wire 18 and the solder connecting portion 20 of the TCP 15A1 are connected via a short through-hole 19. Hence, the parasitic capacitance of the through-hole 19 is negligibly small.

Figure 18:
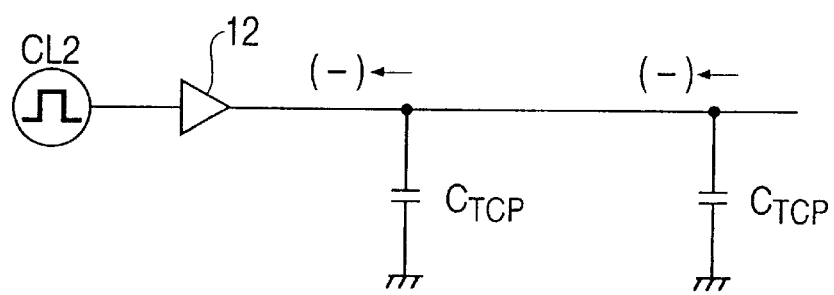
FIG. 18 is an equivalent circuit diagram of the clock wire in the embodiment of FIG. 17.
Figure 19:
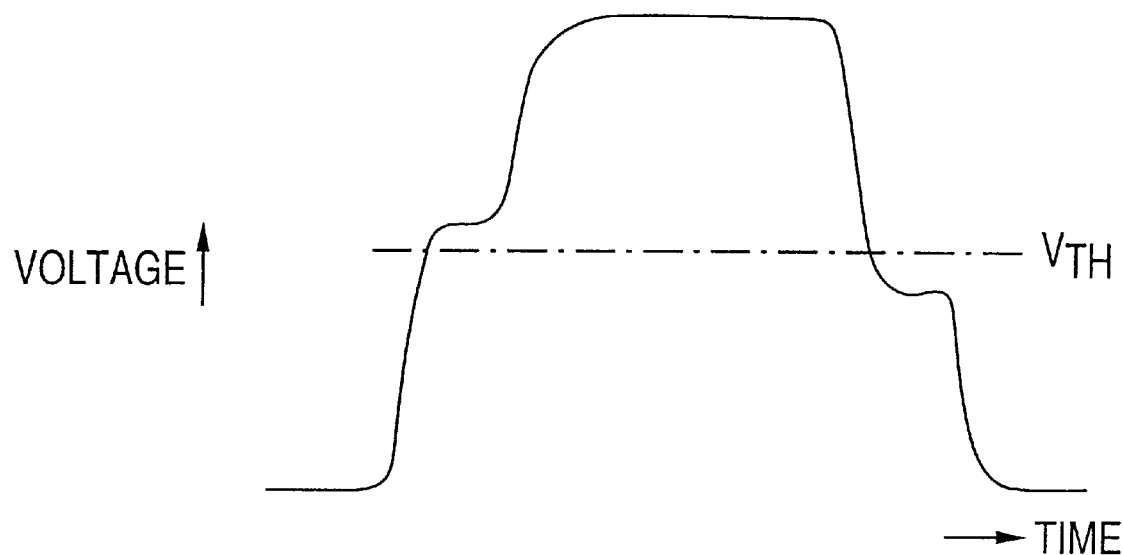
FIG. 19 is a waveform diagram of the pixel clock signal CL2 in the embodiment of FIG. 17.

FIG. 18 is an equivalent circuit of the clock signal wiring in the embodiment of FIG. 17, and FIG. 19 is a waveform diagram of the pixel clock signal CL2. In FIG. 18, because the parasitic capacitance of the clock wire $C_T$ is almost negligible, the reflecting component (−) caused by the parasitic capacitance is very small and substantially the only parasitic capacitance is the input capacitance of TCP $C_{TCP}$. Thus, as shown in FIG. 19, no deformations corresponding to the deformations as those shown at R in FIG. 4 are produced in the waveform of the pixel clock signal CL2, enabling the segment driver 16A1, etc to count the clock at the threshold $V_{TH}$ correctly.

Figure 20A:
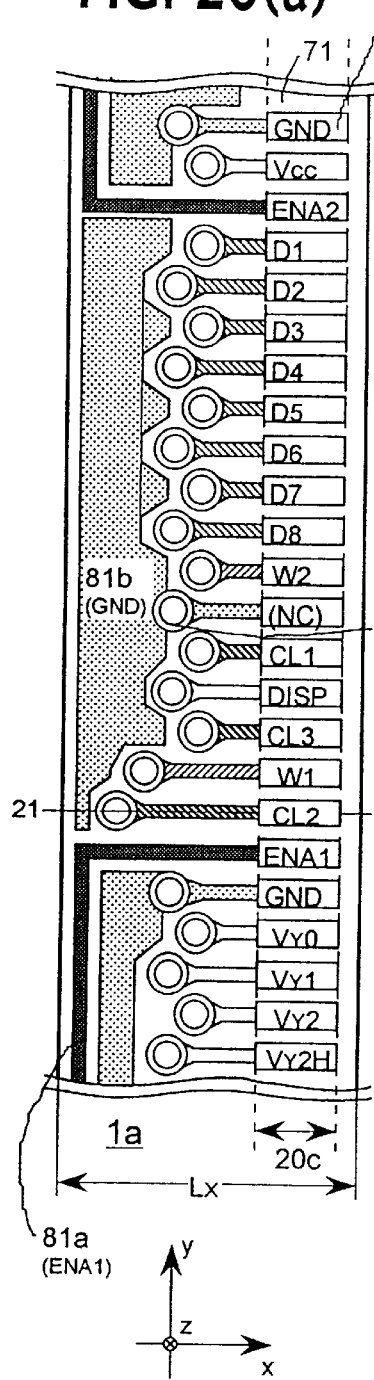
Figure 20B:
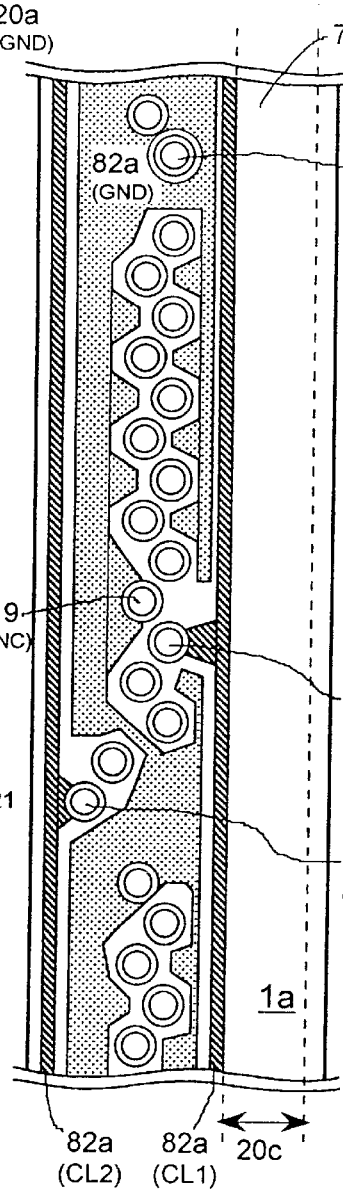
Figure 20C:
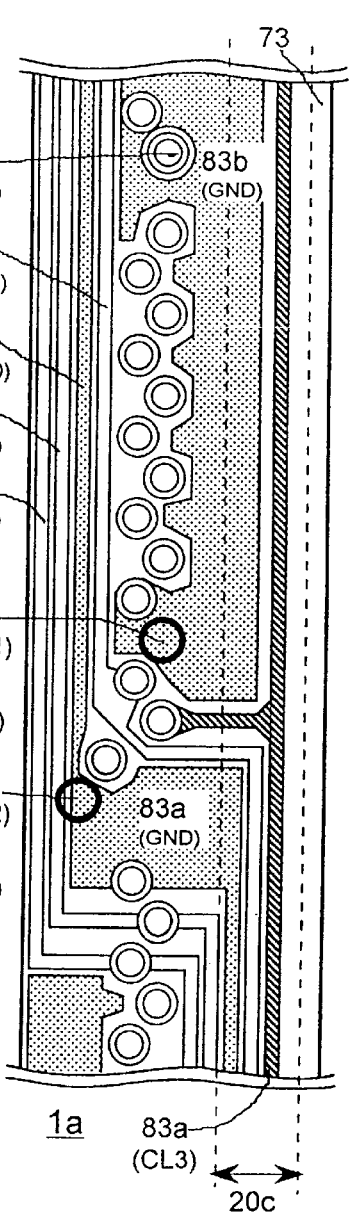
Figure 21:
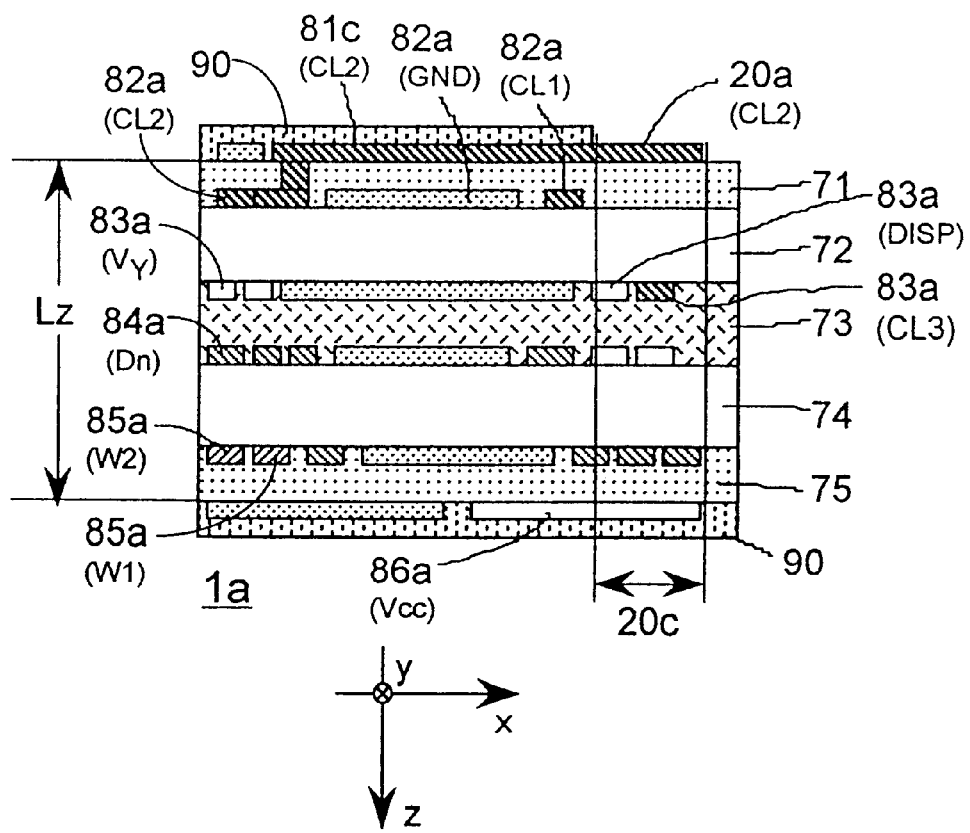
FIG. 21 is a cross section along line 21—21 of the laminated structure of FIG. 20(a)

One of the mutilayer printed circuit boards based on FIG. 17 is explained with reference to FIGS. 20(a) to 20(f). This mutilayer printed circuit board has six layers laminated in the z-direction corresponding to that shown in FIG. 16(b). FIG. 20(a) shows the first stage (the connected surface with the TCP), FIG. 20(b) shows the second stage, FIG. 20(c) shows the third stage, FIG. 20(d) shows the fourth stage, FIG. 20(e) shows the fifth stage, and FIG. 20(f) shows the sixth stage, respectively. The reference numeral of 81a denotes the conductive layer used for a signal transmission or an electricity supply, 81b denotes the conductive layer used for other purpose than that of 81a, and 81c denotes a lead extending between the terminals 20a and the through holes 19. The reference numerals are also altered in accordance to the stage number as 82 for the second first stage, 86 for the sixth stage. The cross section taken along line 22—22 of FIG. 20(a) is shown in FIG. 21.

As shown in FIG. 20(b), both wiring layers 82a for transmitting the pixel clock signal CL2 and the line clock signal CL1 are disposed on the second stage. On the other hand, the frame clock signal CL3 is disposed on the third stage as shown in FIG. 20(c). Therefore each of the clock signal lines CL1, CL2, CL3 are disposed close to the first stage (the connected surface with the TCP) in comparison to a position represented by the center of the thickness of the laminated structure between the third and fourth stages. This layout is recommended in the case that each of the clock signal CL1, CL2, CL3 has a frequency equal to or greater than 10 MHz, especially equal to or greater than 15 MHz. Although when the clock frequency is sufficiently low, the aforementioned miscounting problem can be solved by circuit design without relating to the waveform distortions caused the parasitic capacitance. However, when the clock signal frequency rises up to 10 MHz or higher, the circuit designs for solving the miscounting problem deteriorates high speed performances of the liquid crystal display device attainable by the clock signal having such a high frequencies. Generally, the center of the thickness of the laminated structure is defined by the average of the number of the stages, but may be defined by one half of the laminated thickness from the connected surface with the TCP to the furthest stage having a conductive layer therefrom according to the laminated structure.

Considering the clock signal line in as the line which dominates with respect to the other clock signal lines in the view of the miscounting problem, additional arrangements may be provided.

(1) Enclosing the clock signal line by the wiring lines selected from the groups 2, 3, and 4, the probability of the parasitic capacitance generations is reduced furthermore. The accidental waveform deformation may also be caused by the voltage fluctuation of other conductive layers around the clock signal line, especially around its through hole. The through hole should therefore terminate at the clock signal line layer, and the projection of its termination 19p (shown with bold circles) should confront to the wiring lines selected from the groups 2, 3, and 4, also. Therefore, these wiring lines keep the clock signal line from the influence of the voltage fluctuations. Preferably, at least one of the wiring lines surrounding the clock signal line belongs to the group 4, and furthermore, all of the wiring lines should belong to the group 4. To prevent the voltage fluctuation around the clock signal line, the through hole thereof should be spaced from the terminal region on the first stage and its projection to the stages other than the first stage shown by an area 20c between dotted lines extending in the y-direction in FIGS. 20(a) to 20(f). As shown in FIG. 20(b), according to priority, the through hole of CL2 is disposed opposite side of the projection area 20c of the terminal region 20c in FIG. 20(a) to the second stage, and the through hole of CL1 is disposed closer to the area 20c but slightly off the projection area.

(2) Separating the clock signal line from another clock line as shown in FIGS. 20(b) and 20(c) so as to provide with a space along a stage and between stages enables parasitic capacitance triggered by the electromagnetic interference between the clock signal lines to be suppressed. Preferably, the clock signal line is separated from a signal line such as an image signal line which has a probability of voltage alternation with a short period as that of the clock signal line also. Therefore, the image signal lines and furthermore the wiring lines of the group 1 should be disposed on a the lower stage than the stage on which the clock signal line is disposed, as shown in FIGS. 20(d) and 20(e). Although the through hole of the clock signal CL2 is adjacent to that of the image quality control signal line W1 in FIGS. 20(a) and 20(b), at least one other through hole of the wiring group 2, 3, or 4 should be inserted therein.

Figure 22:
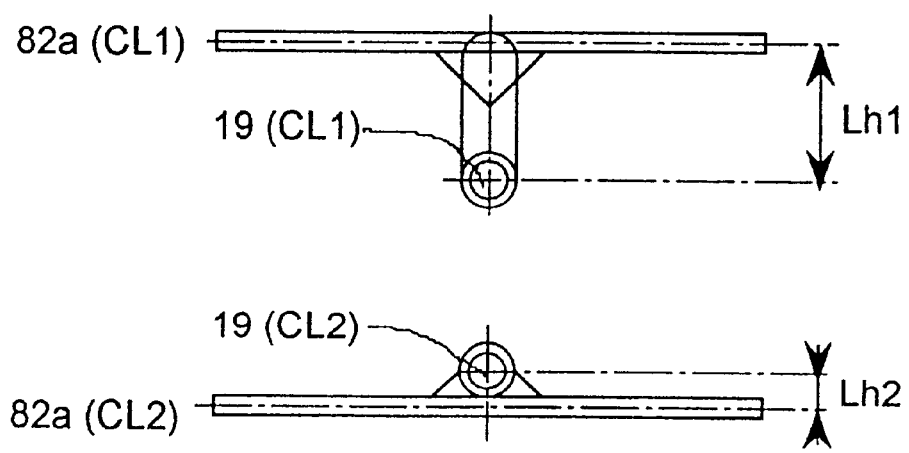
FIG. 22 is a explanatory figure based on FIG. 20(b)

(3) A lead length between the clock signal line to its through hole should be reduced to the smallest possible length so that the probability of parasitic capacitance generated along the lead is reduced. FIG. 22 shows an explanatory figure based on the FIG. 20(b). As shown in FIG. 22, where the length of the lead connection of at least one signal line (CL1) other than the clock signal line given priority (CL2) to its through hole is Lh1, the length of the lead connection of the clock signal line (CL2) to its through hole should be a shorter length such as Lh2.

The preceding explanation is based on the multilayer printed circuit board used at the segment driver side, but in the case of using the multilayer printed circuit board is at the common driver side, the clock signal CL1 has to be given priority over other clock signals. The clock signal CL2 usually passes through the multilayer printed circuit board at the common driver side to that at the segment driver side. Therefore, if there is no logic circuit driven in accordance with the clock signal CL2, the waveform deformation thereof in the multilayer printed circuit board at the common driver side need not be reflected to the wiring lines layout.

Figure 23:
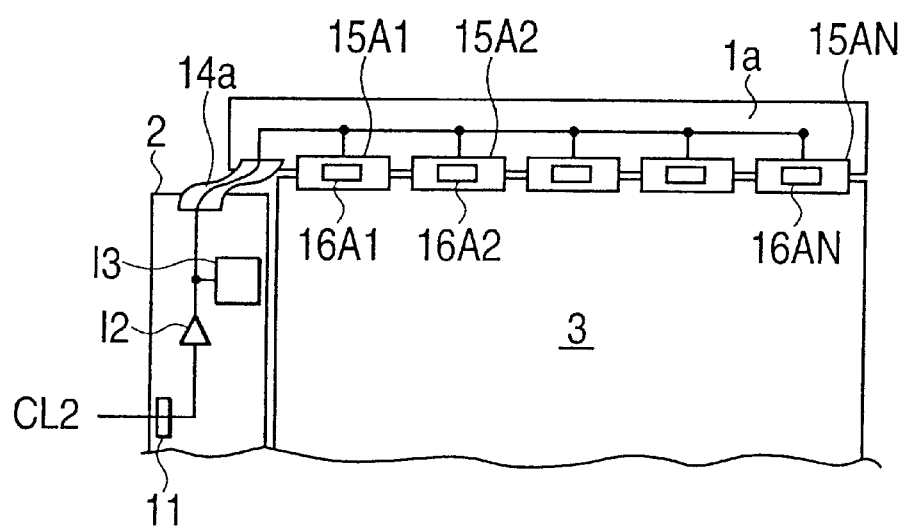
FIG. 23 is a plan view of a portion of an embodiment of the liquid crystal display of the present invention, showing the drive circuit and its associated circuits.

FIG. 23 is a plan view of a portion of the first embodiment of this invention, showing the drive circuit and its associated circuits. In FIG. 23, the second multilayer printed circuit board (also referred to as a common drive substrate) 2 is arranged on the left side of the liquid crystal panel 3 and the pixel clock signal CL2 from the host computer is supplied through the connector 11 to the buffer 12. The buffer 12 changes the level of the pixel clock signal CL2 entered from the host computer to a predetermined level and supplies it to the pixel clock wire. The pixel clock wire is connected from the second multilayer printed circuit board 2 through a joiner 14a to the clock wire of the first multilayer printed circuit board 1a. The clock signal is supplied to the segment drivers 16Al etc through the clock wires of the first multilayer printed circuit board 1a, which was explained by referring to FIG. 17.

As described above, by providing the pixel clock signal wire in an upper layer of the multilayer printed circuit board, the length of the through-hole which connects the pixel clock wire and the TCP is shortened, which in turn reduces the parasitic capacitance and the capacitive reflection noise to a negligible level. Hence, it is possible to obtain high-quality displayed images without flicker.

It should be noted that this invention is not limited to the passive matrix type liquid crystal display but can also be applied to a variety of liquid crystal displays such as active matrix type.

The driver circuits for the passive matrix type liquid crystal display and its peripheral circuits are disclosed, for example, by S. Matsumoto "Liquid Crystal Display Technology: Active-Matrix LCDs" (Sangyo Tosho, Ltd), pages 73–82, and 126–130. As this discloses, the passive matrix type liquid crystal display also requires logic circuits for its pixel data acquisitions and scanning a gate voltage of a desired group of thin film transistor. According to current structure of the passive matrix type liquid crystal display, its pixel data driver is similar to the segment driver, and its scanning driver is similar to the common driver, as mentioned above, not only in structures but in functions as well.

Therefore, the laminated structure of the above mentioned multilayer printed circuit board for the segment drivers can be used at the side of the data line driver circuit (also called, drain line driver circuit, video signal driver circuit) with a little alternation. In the alternation, the analog or digital video signal generated at the interface between the liquid crystal display device and the computer or the television tuner had better be regard as the image signal in the preceding explanations. A plurality of gray-scale voltage supplied to the data line driver are also peculiar to the active matrix type. The wiring line for these voltages belong to the group 4 mentioned before.

This invention has an advantage regardless with the driving type of the liquid crystal display device, and also for electric appliances like the computer of FIG. 9. With this laptop personal computer, it is possible to obtain high-quality display images without flickers that are caused by miscounting of the clock signal and experienced with the prior art.

As described above, this invention can render the miscounting of clock signals by the segment driver unlikely, thereby providing a high-quality liquid crystal display without flicker on display images.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

What is claimed is:

1. A liquid crystal display device comprising:

a liquid crystal panel having a liquid crystal layer held between a first substrate and a second substrate, the first substrate having a first electrode group extending in a first direction, and the second substrate having a second electrode group extending in a second direction transverse to the first direction;

a first multilayer printed circuit board being connected to the first electrode group through a tape carrier pad carrying a plurality of segment drive circuits to apply a pixel drive voltage to the first electrode group, the tape carrier pad being connected with an uppermost wiring layer of the first multilayer printed circuit board; and a second multilayer printed circuit board being connected to the second electrode group through a tape carrier pad carrying a plurality of common drive circuits to apply a common voltage to the second electrode group, the second multilayer printed circuit board having a drive circuit to supply an externally applied pixel clock signal to the segment drive circuits;

wherein a high-speed clock signal wire is provided on one layer of the first multilayer printed circuit board which is located close to an upper surface of the first multilayer printed circuit board so as to reduce parasitic capacitance therealong, and extends via a through-hole to the upper surface of the first multilayer printed circuit board, and wherein a length of the through-hole is limited based upon the location of the one layer of the first multilayer printed circuit board with respect to the upper surface of the first multilayer printed circuit board so as to reduce parasitic capacitance along the high-speed clock signal wire and to suppress miscounting of clock signals transmitted along the high-speed clock signal wire.

2. The liquid crystal display device according to claim 1, wherein the high-speed clock signal wire is a pixel clock signal wire.

3. The liquid crystal display device according to claim 1, wherein the high-speed clock signal wire provided on the one layer of the first multilayer printed circuit board extends along the second direction.

4. A liquid crystal display device comprising:

a pair of substrates constituting a panel in which a liquid crystal layer is sealed;

a first plurality of electrodes extending in a first direction along a main surface of one of the pair of substrates;

a second plurality of electrodes extending in the second direction transverse to the first direction along the main surface of one of the pair of substrates;

a first printed circuit board disposed at a periphery of the panel extending along the second direction, the first printed circuit board having a laminated structure of a plurality of printed circuit layers so as to delimit a laminated thickness thereof, and the first printed circuit board transmitting a first clock signal and a second clock signal having a lower frequency than that of the first clock signal; and a plurality of first driver circuits juxtaposed at a periphery of the panel in the second direction, each of the plurality of first drive circuits having a voltage supply unit for applying voltages to at least one electrode of the first electrodes corresponding thereto, and at least one control unit for controlling the voltage supply in accordance with the first clock signal;

wherein the first printed circuit board has a plurality of electrical contacts with each of the first driver circuits on an uppermost printed circuit layer of the first printed circuit board and respective transmitting lines for the first clock signal and the second clock signal, and supplies the first clock signal in parallel to the respective first driver circuits;

wherein each of the transmitting lines for the first clock signal and the second clock signal is formed at one of the printed circuit layers other than the uppermost printed circuit layer and is connected to one of the plurality of electrical contacts corresponding thereto by a through hole extending along the laminated thickness and a lead disposed between the transmitting line and the through hole at the one of the printed circuit layers; and wherein a lead for the first clock signal being shorter than a lead for the second clock signal, and the printed circuit layer at which the transmitting line for the first clock signal is formed is located closer to the uppermost printed circuit layer than a center of the laminated thickness.

5. The liquid crystal display device according to claim 4, further comprising a plurality of switching elements disposed in the panel, wherein each of the first electrodes controls switching of the switching elements corresponding thereto.

6. A liquid crystal display device comprising:
a pair of substrates constituting a panel in which a liquid crystal layer is sealed;
a first plurality of electrodes extending in a first direction along a main surface of one of the pair of substrates;
a second plurality of electrodes extending in the second direction transverse to the first direction along the main surface of one of the pair of substrates;
a first printed circuit board disposed at a periphery of the panel extending along the second direction, the first printed circuit board having a laminated structure of a plurality of printed circuit layers so as to delimit a laminated thickness thereof, and the first printed circuit board transmitting a first clock signal and a second clock signal having a higher frequency than that of the first clock signal; and
a plurality of first driver circuits juxtaposed at a periphery of the panel in the second direction, each of the plurality of first driver circuits having a voltage supply unit for applying voltages to at least one electrode of the first electrodes corresponding thereto, and at least one control unit for controlling the voltage supply in accordance with the first clock signal;
wherein the first printed circuit board has a plurality of electrical contacts with each of the first driver circuits on an uppermost printed circuit layer of the first printed circuit board and respective transmitting lines for the first clock signal and the second clock signal, and supplies the first clock signal in parallel to the respective first driver circuits;
wherein the transmitting lines for the first clock signal is formed at one of the printed circuit layers which is located closer to the upper surface of the first printed circuit board than a center of the laminated thickness; and
wherein the transmitting lines for the second clock signal is formed at another of the printed circuit layers which located further from the upper surface of the first printed circuit board than the one of the printed circuit layers.

7. The liquid crystal display device according to claim 6, wherein both the first and second plurality of electrodes are arranged with respect to the main surface of only one of the first and second substrates.

8. The liquid crystal display device according to claim 6, further comprising a plurality of switching elements disposed in the panel, wherein each of the first electrodes controls switching of the switching elements corresponding thereto.

9. A liquid crystal display device comprising:
a pair of substrates constituting a panel in which a liquid crystal layer is sealed;
a first plurality of electrodes extending in a first direction along a main surface of one of the pair of substrates;
a second plurality of electrodes extending in the second direction transverse to the first direction along the main surface of one of the pair of substrates;
a first printed circuit board disposed at a periphery of the panel extending along the second direction, the first printed circuit board having a laminated structure of a plurality of printed circuit layers so as to delimit a laminated thickness thereof, and the first printed circuit board transmitting a first clock signal, a second clock signal having a lower frequency than that of the first clock signal and an image signal; and
a plurality of first driver circuits juxtaposed at a periphery of the panel in the second direction, each of the plurality of first driver circuits acquires the image signal to be supplied to at least one electrode of the first electrodes corresponding thereto in accordance with the first clock signal;
wherein the first printed circuit board has a plurality of electrical contacts with each of the first driver circuits on an uppermost printed circuit layer of the first printed circuit board, transmitting lines for the first clock signal, the second clock signal and the image signal, and supplies the first clock signal in parallel to the respective first driver circuits;
wherein the transmitting line for the first clock signal is formed at one of the printed circuit layers other than the uppermost printed circuit layer and is connected to one of the plurality of electrical contacts corresponding thereto by a through hole;
wherein the one of the printed circuit layers is located closer to the uppermost printed circuit layer than a center of the laminated thickness; and
wherein a driver voltage line for supplying driving electricity to the respective first driver circuits is formed at another of the printed circuit layers which is located further from the uppermost printed circuit layer than the one of the printed circuit layers.

10. The liquid crystal display device according to claim 9, wherein the first plurality of electrodes is arranged with respect to the main surface of the first substrate, and the second plurality of electrodes is arranged with respect to the main surface of the second substrate.

11. The liquid crystal display device according to claim 9, wherein the transmitting line for the first clock signal is disposed in the uppermost printed circuit layer of the first printed circuit board.

12. The liquid crystal display device according to claim 9, wherein the laminated thickness is defined by the number N of the printed circuit layers from the upper surface to a lower surface of the first printed circuit board, and the transmitting line for the first clock signal is disposed in one of the printed circuit layers within a number smaller than N/2 from the upper surface of the first printed circuit board.

13. The liquid crystal display device according to claim 12, wherein the first printed circuit board has at least six printed circuit layers, the transmitting line for the first clock signal is disposed in one of the second and third printed circuit layers from the upper surface of the first printed circuit board.

14. The liquid crystal display device according to claim 9, wherein the laminated thickness is defined by the distance from an upper surface of the first printed circuit layer to a bottom surface of the last printed circuit layer of the laminated first printed circuit board.

15. The liquid crystal display device according to claim 9, wherein the first clock signal has a higher frequency than 10 MHz.

16. The liquid crystal display device according to claim 9, wherein the first clock signal has a frequency equal to or higher than 15 MHz.

17. The liquid crystal display device according to claim 9, wherein each control unit of the first driver circuits has a sequential logic circuit therein which outputs control signals for controlling voltage applications to the respective electrodes corresponding to the first driver circuit in accordance with the first clock signal.

18. The liquid crystal display device according to claim 9, wherein the first printed circuit board supplies a second clock signal having a higher frequency than that of the at least one clock signal, and the second clock signal is transmitted by a second transmitting line disposed on one of the printed circuit layers on which the transmitting line for the first clock signal is disposed so as to be spaced from the second transmitting line.

19. The liquid crystal display device according to claim 18, further comprising a plurality of switching elements disposed in the panel, wherein each of the first electrodes controls switching of the switching elements corresponding thereto.

20. The liquid crystal display device according to claim 9, wherein the transmitting line for transmitting the first clock signal is disposed on one of the printed circuit layers other than the uppermost printed circuit layer, is connected with the electrical contacts formed on the uppermost printed circuit layer by a through hole extending from the uppermost printed circuit layer to the one of the printed circuit layers, and at least a region for connecting the transmitting line with the through hole is surrounded by the conductive material.

21. The liquid crystal display device according to claim 20, further comprising a plurality of switching elements disposed in the panel, wherein each of the first electrodes is electrically connected with each terminal of the switching elements corresponding thereto.

22. The liquid crystal display device according to claim 9, wherein the transmitting line for the image signal is formed at any one of the printed circuit layers which is located further from the uppermost printed circuit layer than the one of the printed circuit layers.

23. The liquid crystal display device according to claim 9, wherein each of the transmitting lines for the first clock signal, the second clock signal, and the image signal, and the driver voltage line is extended along the second direction.

24. The liquid crystal display device according to claim 9, further comprising a conductive layer being formed at the uppermost printed circuit layer, the conductive layer not being electrically connected to any one of transmitting lines for the first clock signal, the second clock signal, and the image signal, and being disposed above the transmitting line for the first clock signal.

25. The liquid crystal display device according to claim 9, further comprising a plurality of switching elements disposed in the panel, wherein each of the first electrodes controls switching of the switching elements corresponding thereto.

* * * * *